US012764998B2

(12) United States Patent
Kumar et al.

(10) Patent No.: US 12,764,998 B2
(45) Date of Patent: Oct. 13, 2026

(54) SELF-ALIGNED EMBEDDED SOURCE AND DRAIN CONTACTS

(71) Applicant: Intel Corporation, Santa Clara, CA (US)

(72) Inventors: Nitesh Kumar, Beaverton, OR (US); Willy Rachmady, Beaverton, OR (US); Cheng-Ying Huang, Hillsboro, OR (US); Rohit Galatage, Hillsboro, OR (US); Patrick Morrow, Portland, OR (US); Marko Radosavljevic, Portland, OR (US); Jami A. Wiedemer, Scappoose, OR (US); Subrina Rafique, Beaverton, OR (US); Mauro J. Kobrinsky, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 236 days.

(21) Appl. No.: 17/851,658

(22) Filed: Jun. 28, 2022

(65) Prior Publication Data

US 2023/0420528 A1 Dec. 28, 2023

(51) Int. Cl.

| | |
|---|---|
| ***H10D 64/01*** | (2025.01) |
| ***H10D 30/67*** | (2025.01) |
| ***H10D 62/13*** | (2025.01) |
| ***H10D 84/83*** | (2025.01) |
| *H10D 30/01* | (2025.01) |
| *H10D 62/10* | (2025.01) |

(52) U.S. Cl.

CPC ....... *H10D 30/6729* (2025.01); *H10D 62/151* (2025.01); *H10D 64/01* (2025.01); *H10D 84/83* (2025.01); *H10D 30/014* (2025.01); *H10D 30/031* (2025.01); *H10D 30/6735* (2025.01); *H10D 30/6757* (2025.01); *H10D 62/121* (2025.01)

(58) Field of Classification Search

CPC .. H10D 30/6729; H10D 62/151; H10D 64/01; H10D 84/83; H10D 30/014; H10D 30/031; H10D 30/6735; H10D 30/6757; H10D 62/121; H10D 30/43; H10D 30/6219; H10D 64/251; H10D 64/256; H10D 30/797; H10D 84/0149

See application file for complete search history.

(56) References Cited

U.S. PATENT DOCUMENTS

| | | | | |
|---|---|---|---|---|
| 10,388,732 | B1 * | 8/2019 | Frougier | H10D 62/121 |
| 2015/0255604 | A1 * | 9/2015 | Yang | H10D 30/6219 257/192 |
| 2018/0219090 | A1 * | 8/2018 | Morrow | H10D 30/60 |
| 2019/0148503 | A1 * | 5/2019 | Choi | H10D 30/024 257/288 |
| 2020/0105759 | A1 * | 4/2020 | Bowonder | H10D 64/254 |

* cited by examiner

*Primary Examiner* — Marlon T Fletcher
*Assistant Examiner* — Da Wei Lee
(74) *Attorney, Agent, or Firm* — Arcane Law PLLC

(57) ABSTRACT

An integrated circuit structure includes a source or drain region, and a contact for the source or drain region. The contact has (i) an upper portion outside the source or drain region and (ii) a lower portion extending within the source or drain region. For example, the source or drain region wraps around the lower portion of the contact, such that an entire perimeter of the lower portion of the contact is adjacent to the source or drain region.

21 Claims, 18 Drawing Sheets

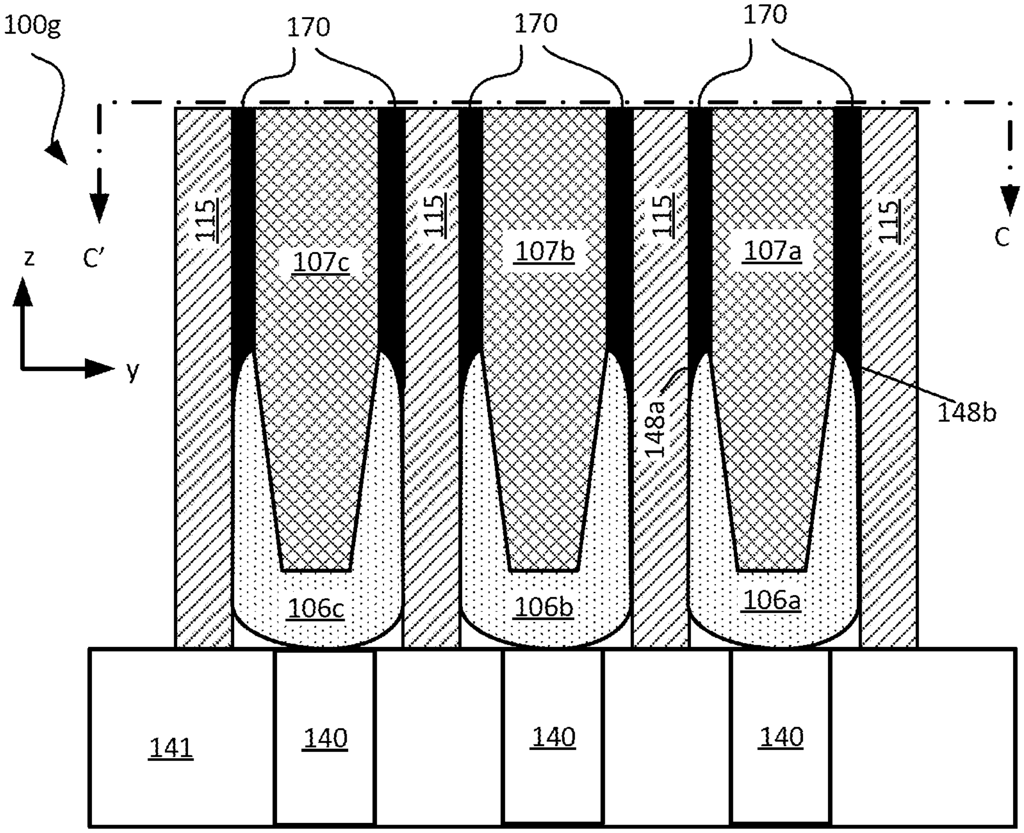
FIG. 1G1
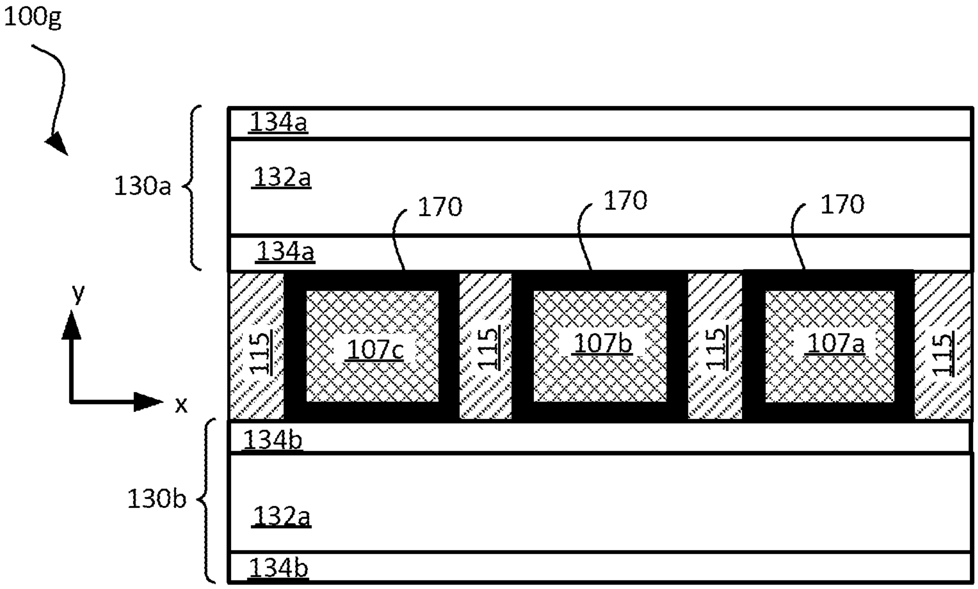
FIG. 1G2

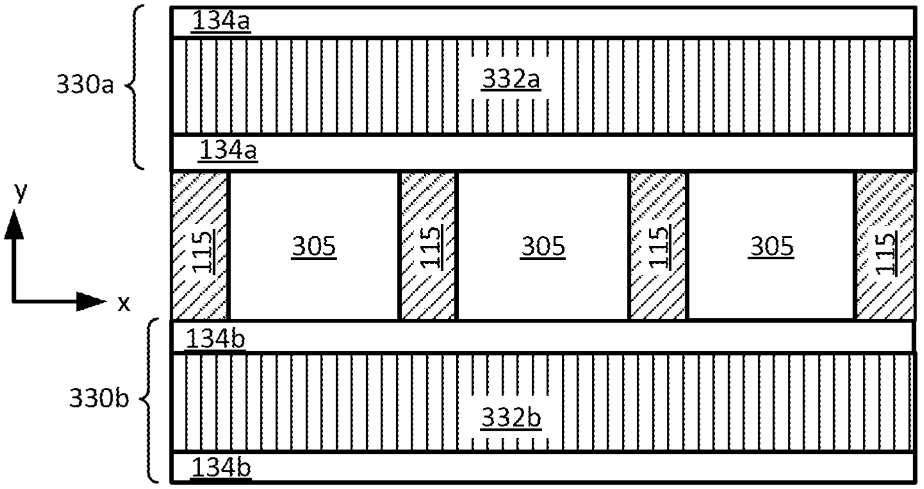
FIG. 3A1
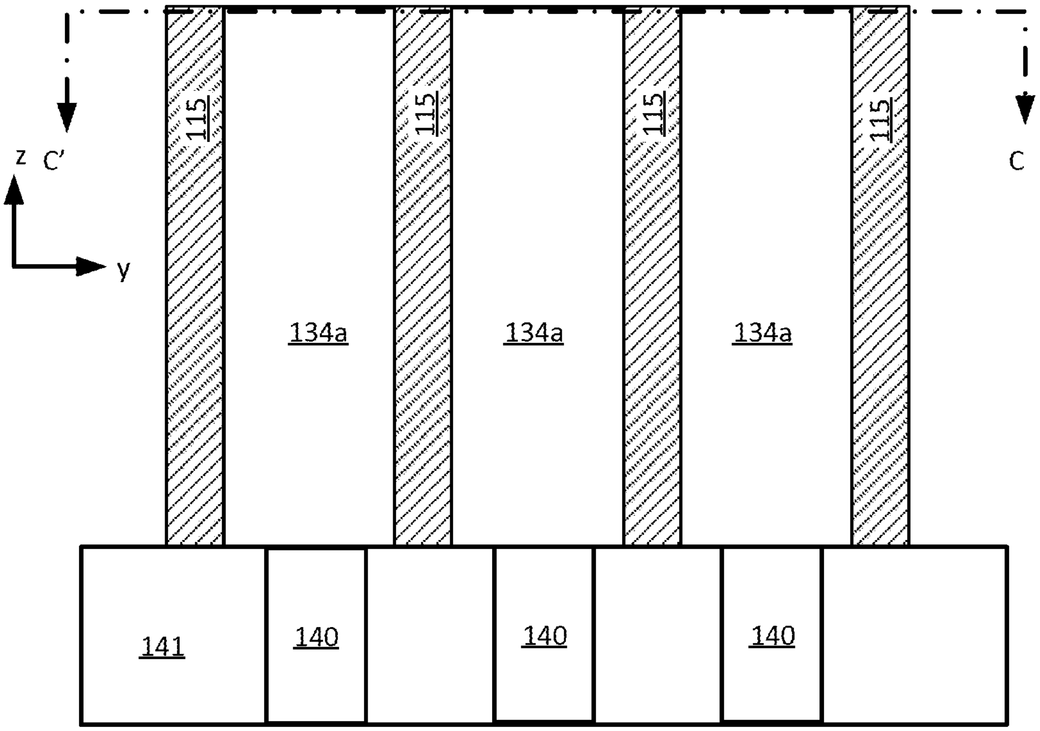
FIG. 3A2

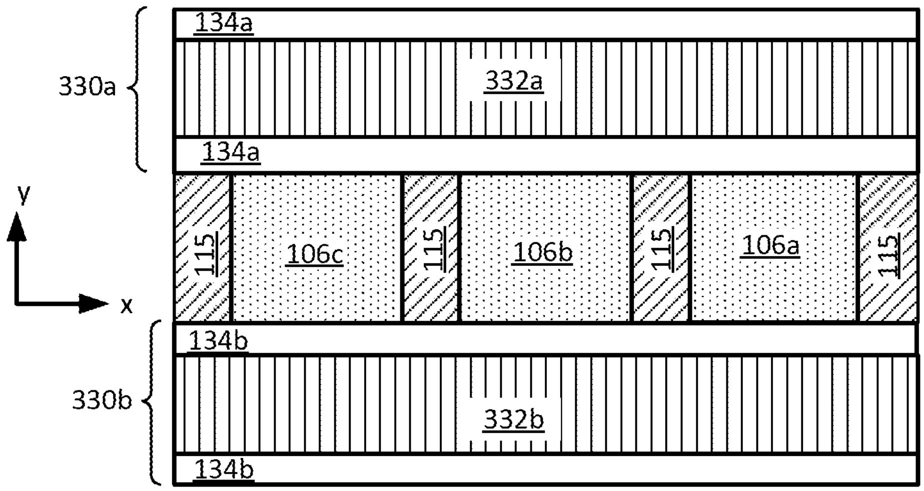
FIG. 3B1
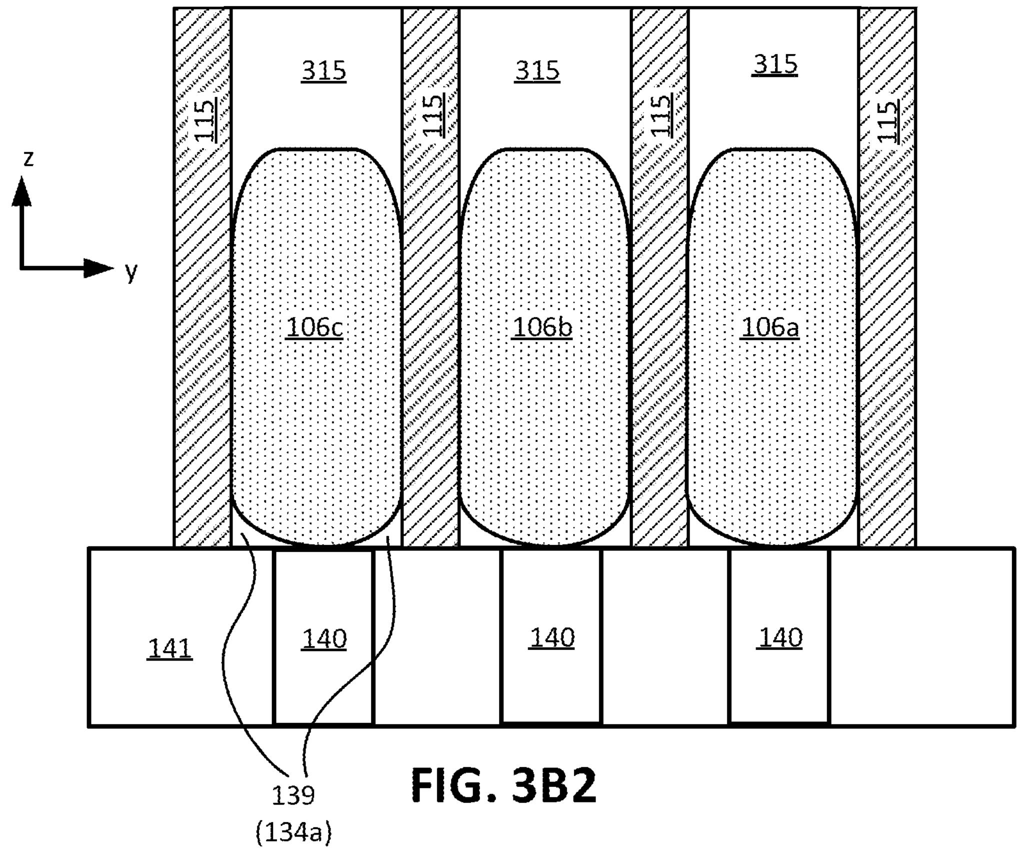
FIG. 3B2

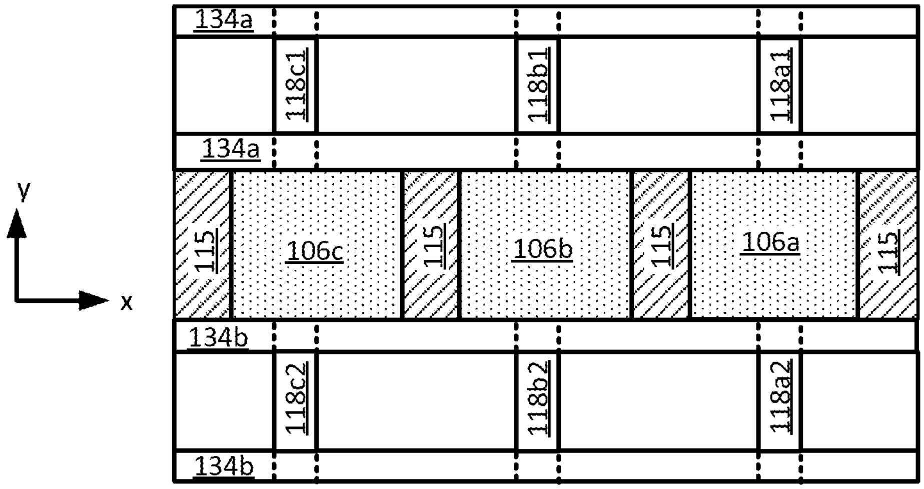
FIG. 3C1
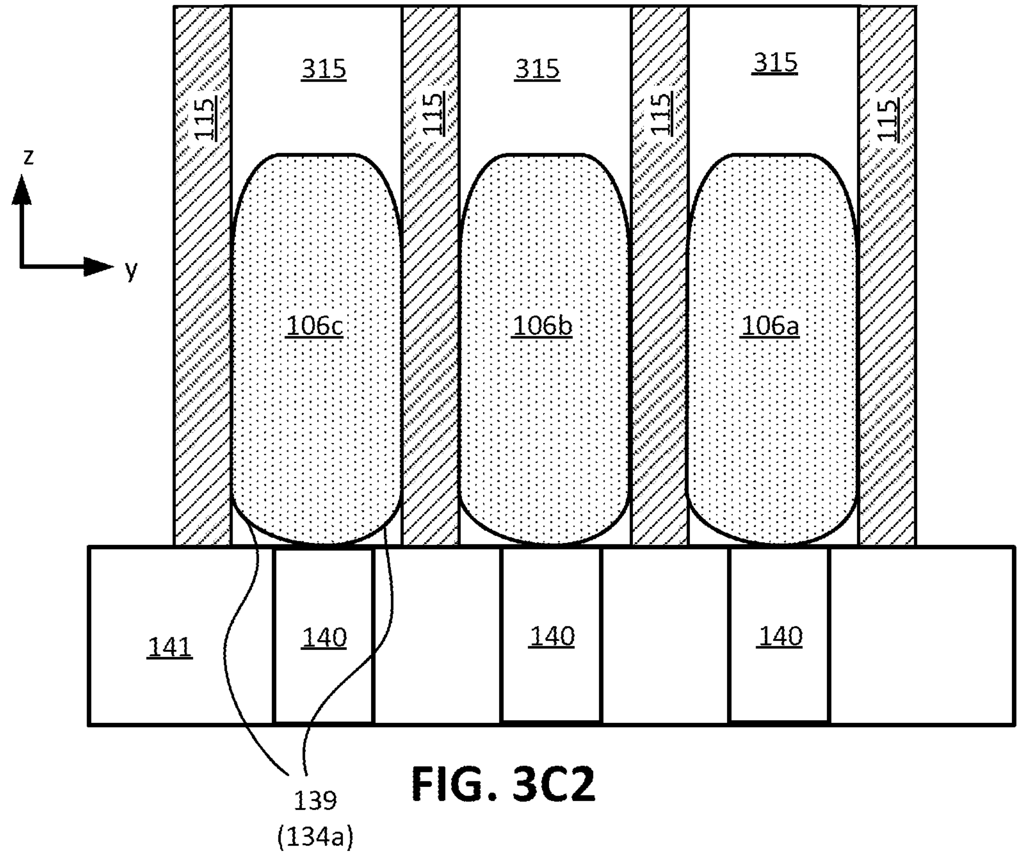
FIG. 3C2

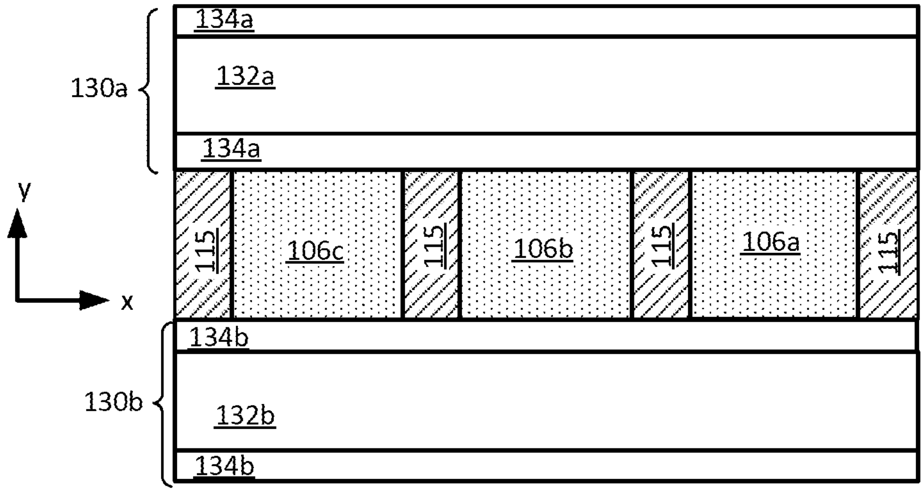
FIG. 3D1
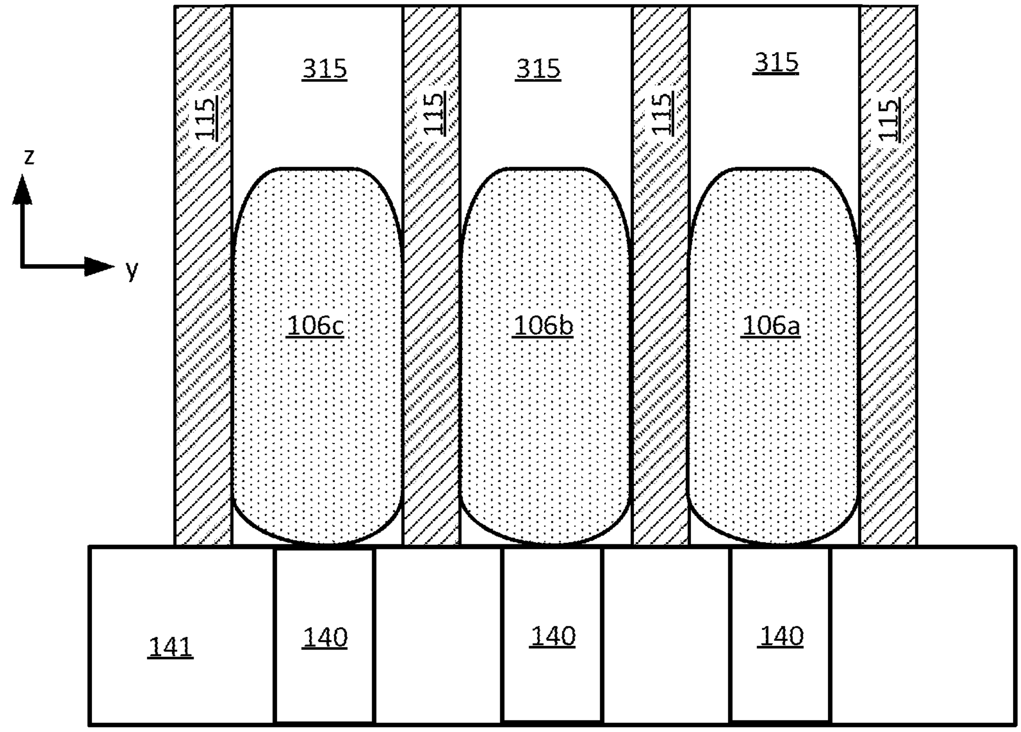
FIG. 3D2

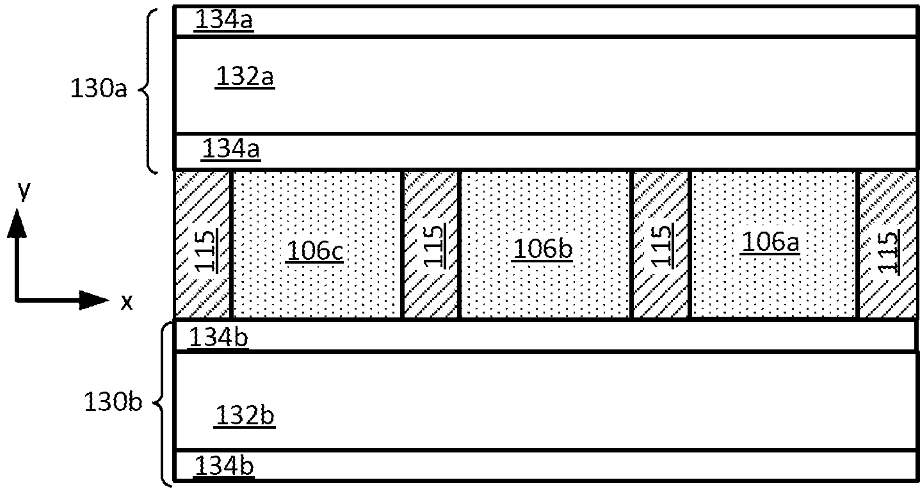
FIG. 3E1
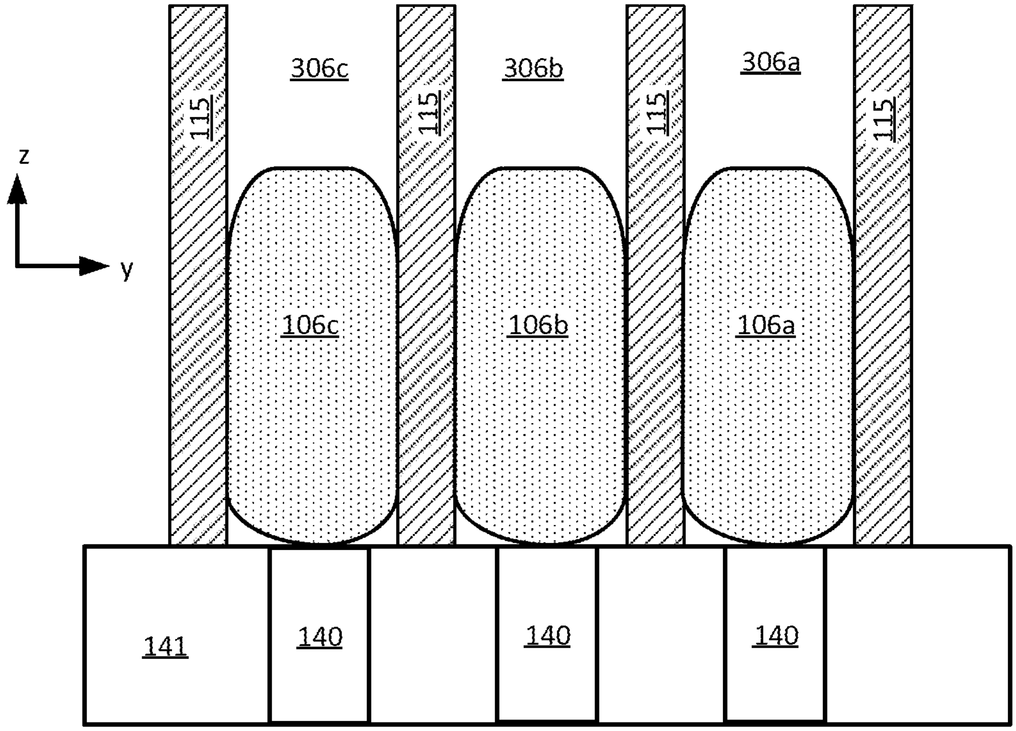
FIG. 3E2

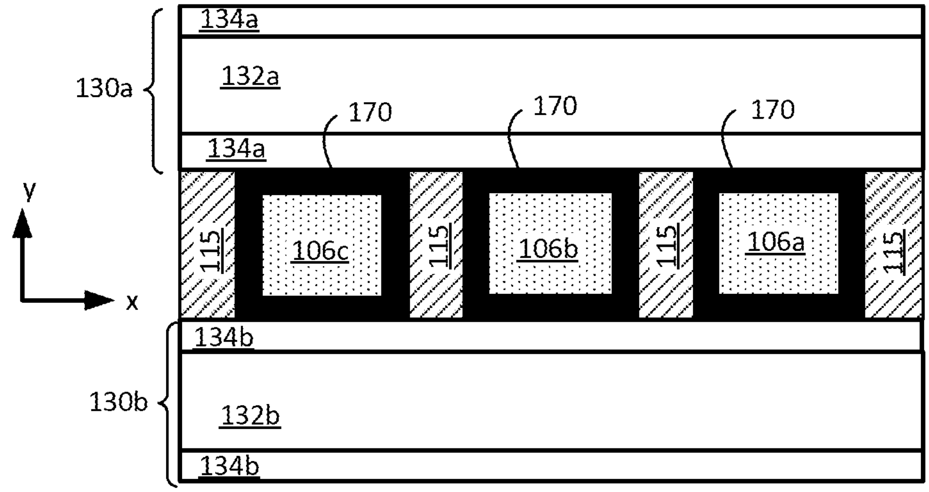
FIG. 3F1
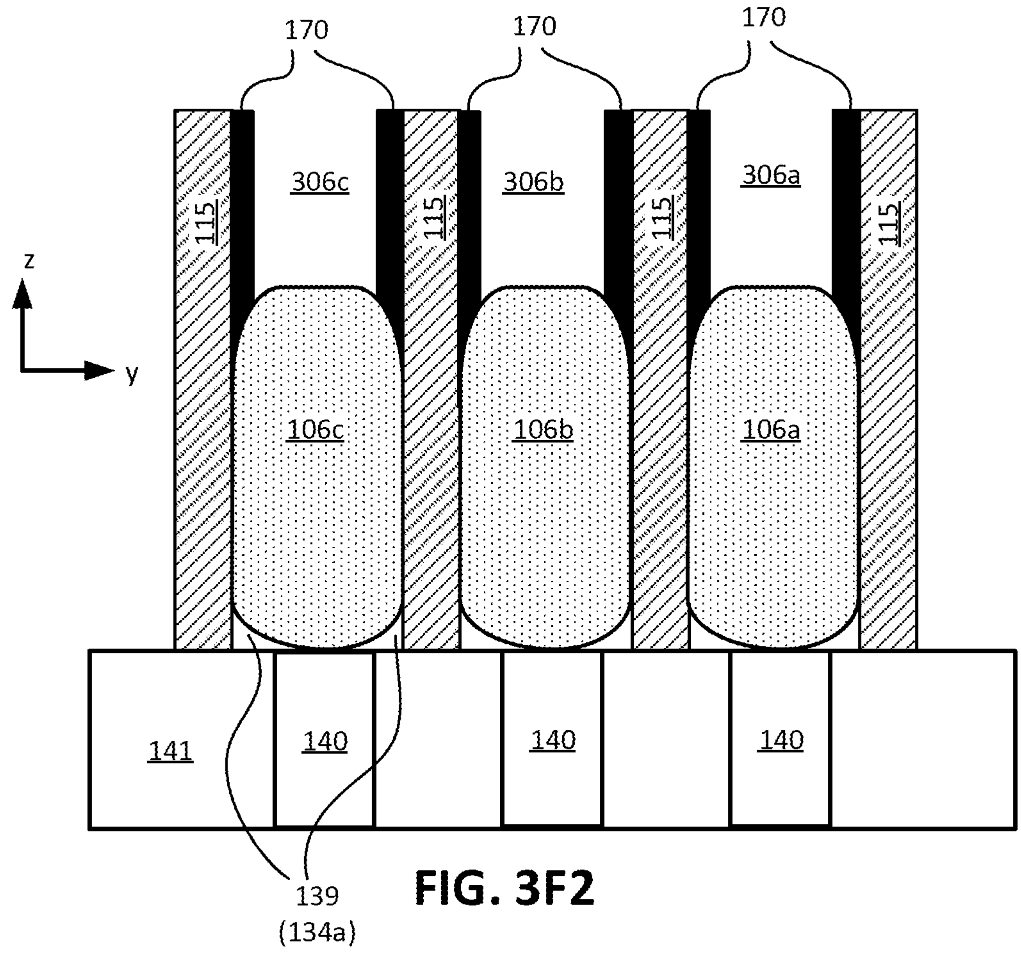
FIG. 3F2

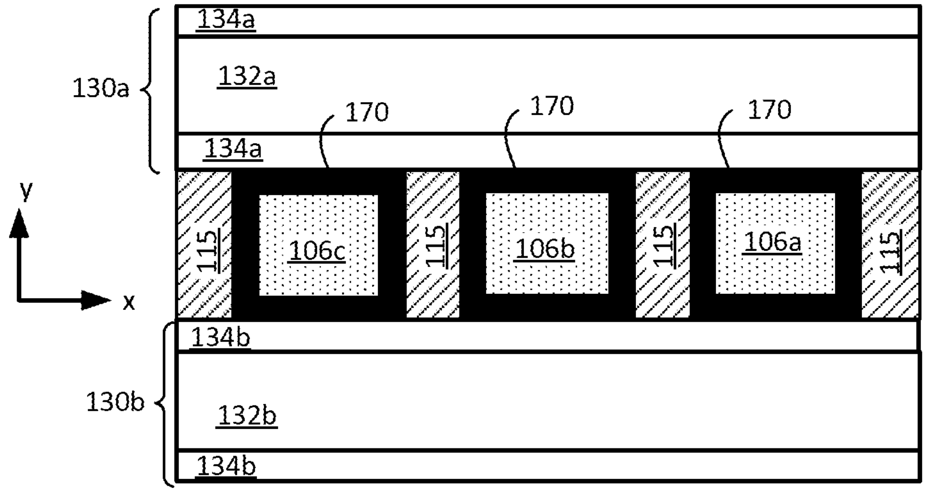
FIG. 3G1
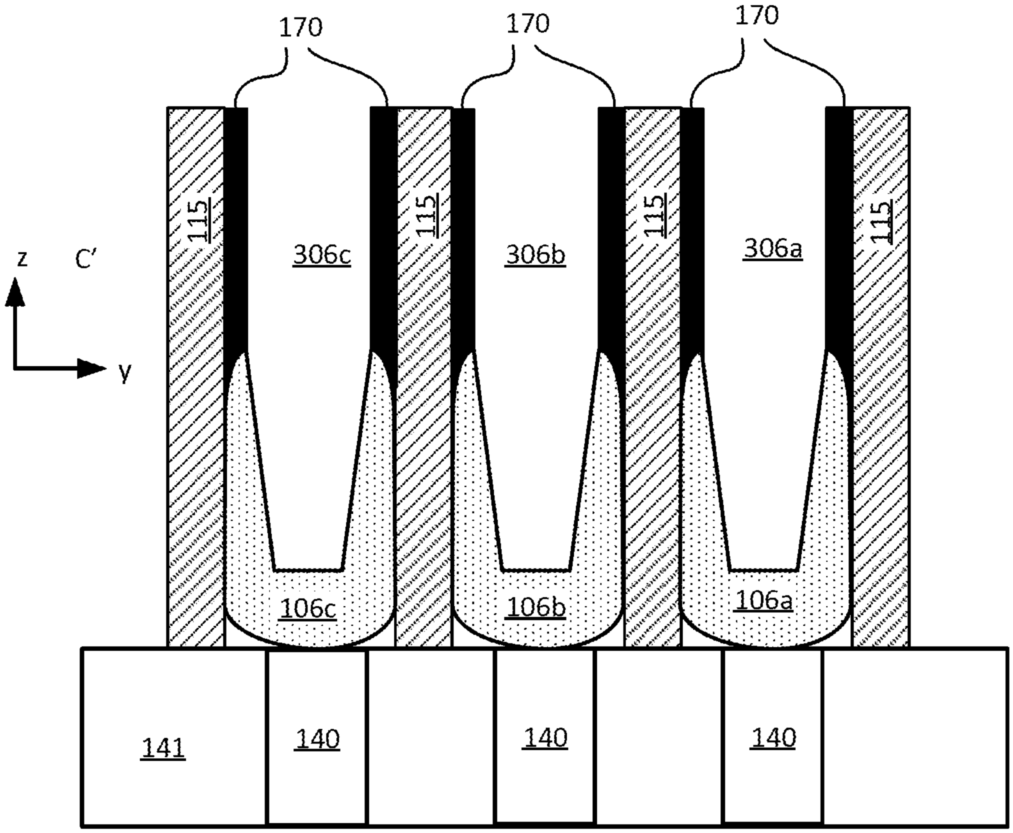
FIG. 3G2

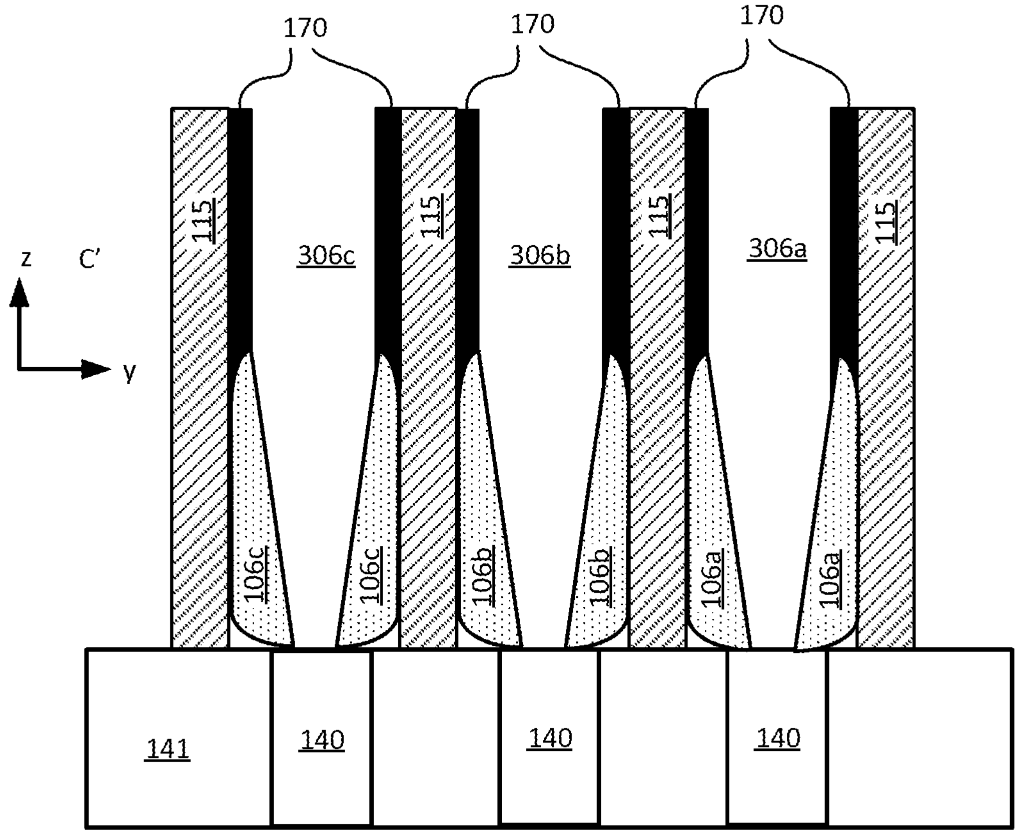
FIG. 3G3

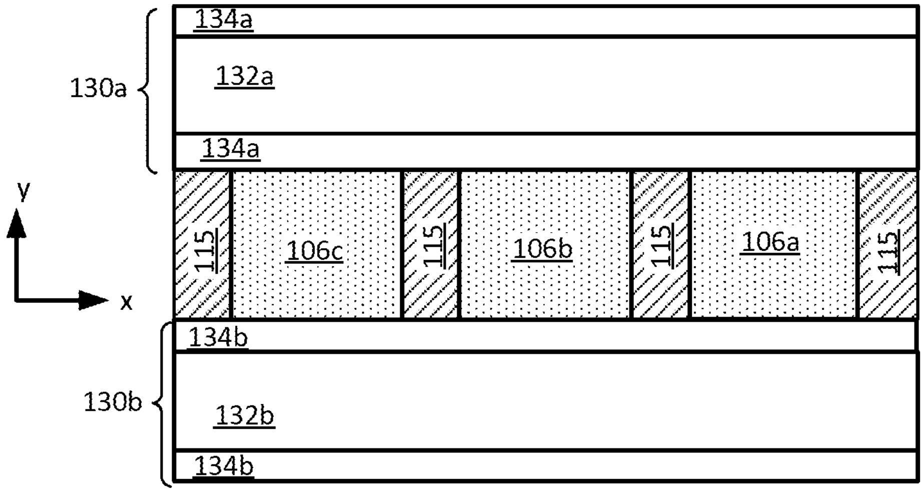
FIG. 3H1
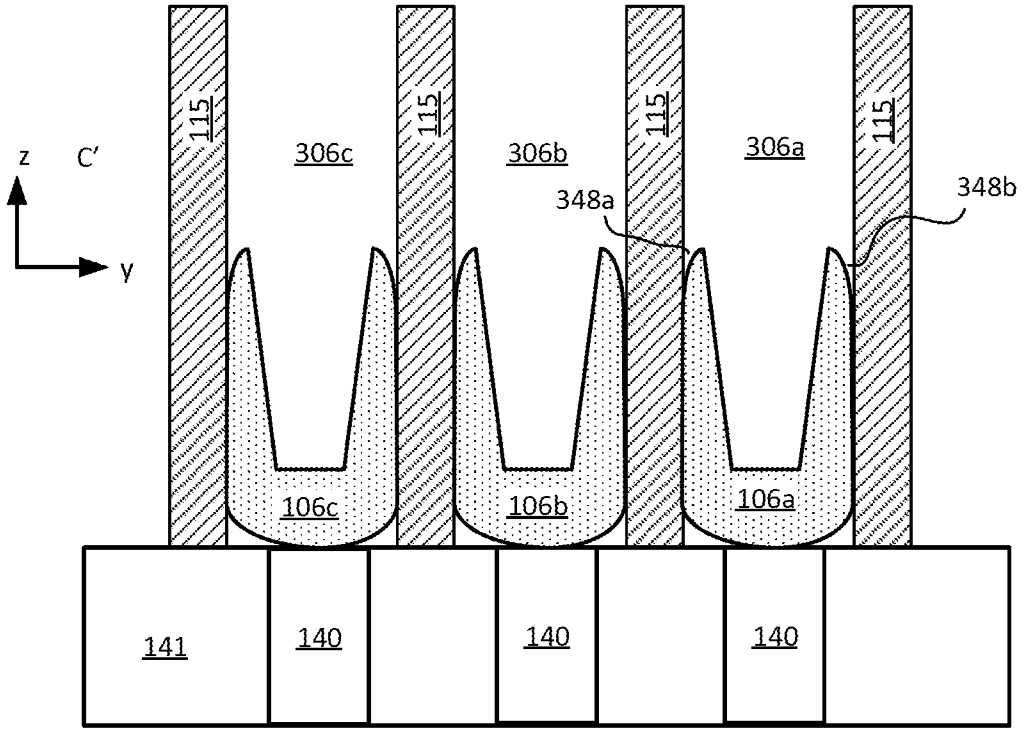
FIG. 3H2

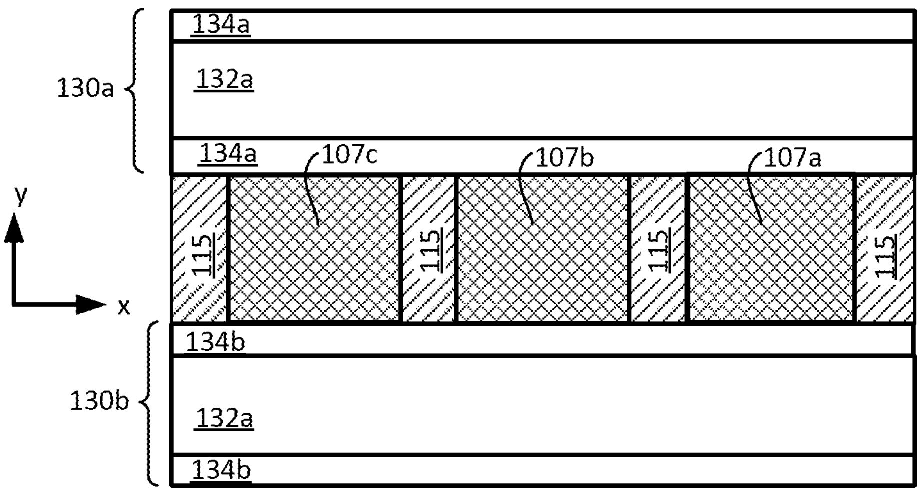
FIG. 3I1
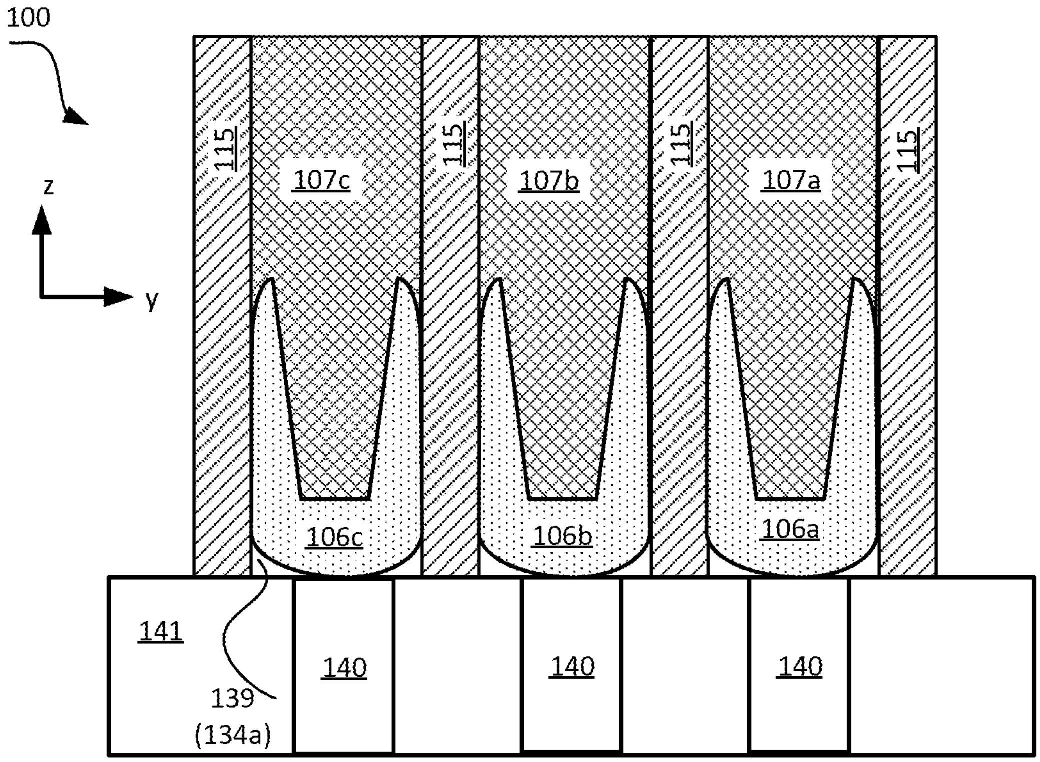
FIG. 3I2

SELF-ALIGNED EMBEDDED SOURCE AND DRAIN CONTACTS

FIELD OF THE DISCLOSURE

The present disclosure relates to integrated circuits, and more particularly, to source and drain contacts of transistor devices.

BACKGROUND

Integrated circuitry continues to scale to smaller feature dimensions and higher transistor densities. As a result, a gate pitch, as well as a pitch for source and drain contacts, continue to reduce. This reduces contact area between a source or drain region and a corresponding source or drain contact, which leads to increased contact resistance and which may negatively impacting transistor performance.

BRIEF DESCRIPTION OF THE DRAWINGS

FIGS. 1G1 and 1G2 illustrate various views of an integrated circuit structure that is at least in part similar to the integrated circuit structure of FIGS. 1A-1D, where upper portions of each source or drain contact is surrounded by a liner layer, in accordance with an embodiment of the present disclosure.

FIG. 2 illustrates a flowchart depicting a method of forming the example semiconductor structure of FIGS. 1A-1D, in accordance with an embodiment of the present disclosure.

FIGS. 3A1, 3A2, 3B1, 3B2, 3C1, 3C2, 3D1, 3D2, 3E1, 3E2, 3F1, 3F2, 3G1, 3G2, 3Ga, 3Gb, 3G3, 3H1, 3H2, 3I1, and 3I2 collectively illustrate various views of an example semiconductor structure in various stages of processing, in accordance with an embodiment of the present disclosure.

Figure 1A:
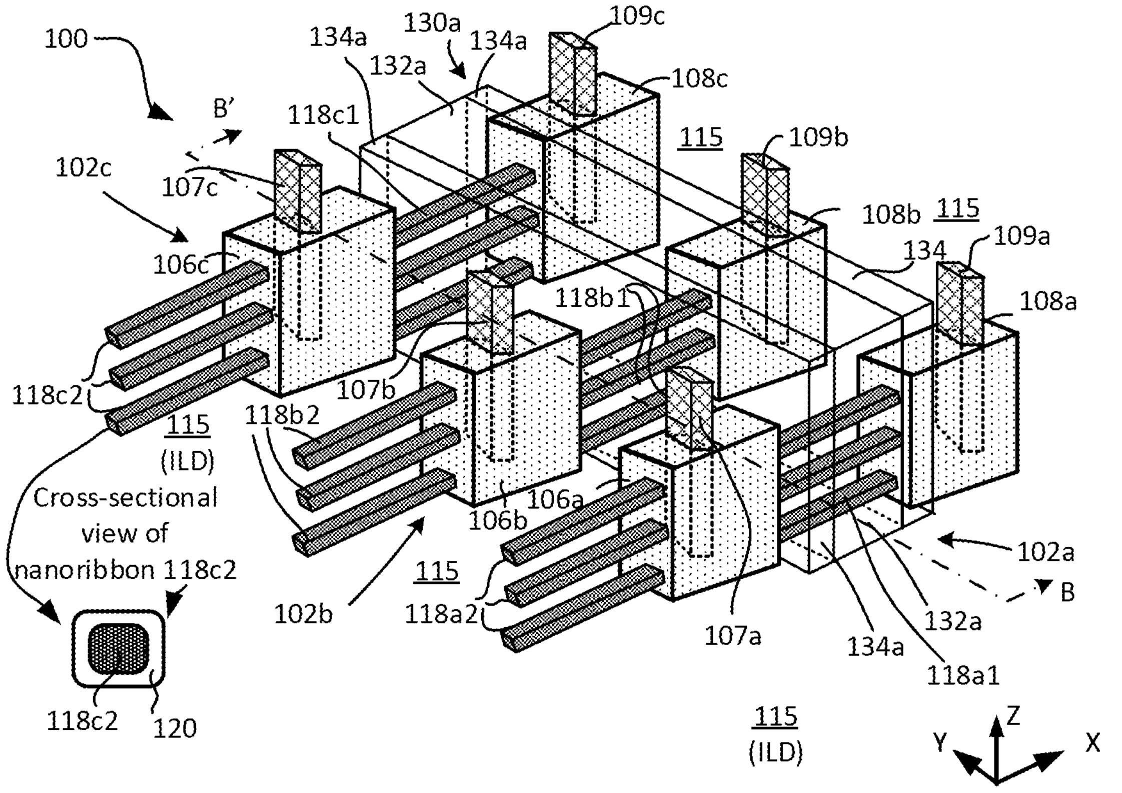
FIGS. 1A, 1B, 1C, and 1D illustrate various views of an integrated circuit structure including a plurality of devices comprising (i) a plurality of source and drain regions and (ii) a corresponding plurality of source or drain contacts, where each source or drain contact at least in part extends within a corresponding source or drain region, such that a source or drain region wraps around a section of a corresponding source or drain contact, wherein laterally adjacent source or drain regions are separated by corresponding dielectric material, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

An integrated circuit structure is disclosed that includes a plurality of source or drain regions, and a corresponding plurality of source or drain contacts, where a lower section of each contact is embedded within the corresponding source or drain region. For example, the source or drain region wraps around the lower section of the corresponding contact, such that an entire perimeter of the lower portion of the contact is adjacent to the source or drain region. This reduces contact resistance between the contact and the corresponding source or drain region, thereby improving performance of the integrated circuit structure. An upper section of a contact is outside (e.g., at least in part above) the corresponding source or drain region. In an example, the upper section of a contact is adjacent to (e.g., neighboring to and/or in contact with) (i) a first gate spacer of a first gate stack on a first side, (ii) a second gate spacer of a second gate stack on a second side, where the first and second sides are opposite sides of the contact, and (iii) dielectric material on a third side and a fourth side, where the third and fourth sides are opposite sides of the contact.

In one embodiment, an integrated circuit structure comprises a source or drain region, and a contact for the source or drain region. The contact has (i) an upper portion outside the source or drain region and (ii) a lower portion extending within the source or drain region. For example, the source or drain region wraps around the lower portion of the contact, such that an entire perimeter of the lower portion is adjacent to the source or drain region. In an example, first dielectric material is on a first side of the source or drain region, and second dielectric material is on a second side of the source or drain region, such that the source or drain region is laterally between the first and second dielectric materials. For example, at least a corresponding section of the source or drain region is in contact with each of the first and second dielectric materials. In an example, a first section of the upper portion of the contact is laterally between the source or drain region and the first dielectric material. In an example, a second section of the upper portion of the contact is laterally between the source or drain region and the second dielectric material. For example, an imaginary horizontal line passes through the first dielectric material, the first section of the upper portion of the contact, the source or drain region, the lower portion of the contact, the second section of the upper portion of the contact, and the second dielectric material.

In another embodiment, an integrated circuit structure comprises a first source or drain region of a first device, a second source or drain region of a second device, and a third source or drain region of a third device. in an example, first dielectric material is laterally between the first source or drain region and the second source or drain region, and second dielectric material is laterally between the first source or drain region and the third source or drain region. In an example, the integrated circuit structure comprises a first gate stack and a second gate stack, wherein the first, second, and third source or drain regions are laterally between the first gate stack and the second gate stack. In an example, a contact for the first source or drain region comprises (i) a first portion outside the first source or drain region and (ii) a second portion extending within the first source or drain region. In an example, the first portion of the contact is adjacent to the first gate stack (e.g., a first gate spacer of the first gate stack), the second gate stack (e.g., a second gate spacer of the second gate stack), the first dielectric material, and the second dielectric material. In an example, the source or drain region wraps around the second portion of the contact, such that an entire perimeter of the second portion of the contact is adjacent to the source or drain region.

In yet another embodiment, a method of forming a contact extending through a first source or a drain region comprises forming the first source or drain region of a first device, a second source or drain region of a second device, and a third source or drain region of a third device. In an example, first dielectric material is laterally between the first source or drain region and the second source or drain region, and second dielectric material is laterally between the first source or drain region and the third source or drain region. In an example, the method further includes forming a first gate stack and a second gate stack, such that the first, second, and third source or drain regions are laterally between the first gate stack and the second gate stack. In an example, the method further includes forming a layer of dielectric material above a peripheral section of a top surface of the first source or drain region, wherein the layer is adjacent to the first dielectric material, the second dielectric material, the first gate stack, and the second gate stack. The layer defines an opening above a central section of the top surface of the first source or drain region. In an example, the method further includes removing a portion of the first source or drain region through the opening, so as to extend the opening within the first source or drain region. In an example, the method further includes forming the contact having (i) a lower section within the opening that is within the first source or drain region, and (ii) an upper section outside the opening that is within the first source or drain region. In an example, the source or drain region wraps around the lower section of the contact, such that an entire perimeter of the lower section of the contact is adjacent to the source or drain region. Numerous configurations and variations will be apparent in light of this disclosure.

General Overview

As previously discussed herein, with scaling of integrated circuitry, contact area between a source or drain region and a corresponding source or drain contact reduces, thereby correspondingly increasing the contact resistance. Accordingly, techniques are provided herein to form an IC that includes transistor devices comprising source and drain contacts that extend within the corresponding source and drain regions. The following discussion focuses on source regions and corresponding source contacts, but also applies to drain regions and corresponding drain contacts as well. Continuing with the above discussion in which the source contact extends within the corresponding source region, in an example, the source contact has an upper section and a lower section, where the upper section of the source contact is above the source region, and the lower section of the source contact extends within the source region. For example, the source region warps around the lower section of the source contact. For example, the source region is adjacent to an entire perimeter of the lower section of the source contact. Thus, the source region forms a close loop around the lower section of the source contact (e.g., the source region is on all sides of the lower section of the source contact).

In an example, the source contact extends within (but not through) the source region, such that a lower surface of the source contact is embedded within the source region (e.g., see FIG. 1*i*). In another example, the source contact extends through the source region, such that a lower surface of the source contact is in contact with a component (such as a substrate or a sub-fin area) below the source region (e.g., see FIG. 1F).

In an example, two or more source regions of corresponding two or more devices are arranged to be laterally adjacent, e.g., see FIG. 1A. Again, any discussion with respect to source regions also applies to drain regions as well. A pitch of such laterally adjacent source regions can be tight, and in an example, such laterally adjacent source regions are separated by dielectric material, such as interlayer dielectric (ILD). Assume a middle source region having a laterally adjacent right source region on one side, and a laterally adjacent left source region on another side, where the middle source region is separated from the right source region by right ILD, and where the middle source region is separated from the left source region by left ILD. In an example where two or more devices are formed in series, the laterally adjacent middle, right, and left source regions can have a first gate stack on one side and a second gate stack on another side (e.g., see gate stacks 130*a* and 130*b* discussed herein later with respect to FIGS. 1A-1D). Thus, for example, the middle, right, and left source regions are laterally between the first gate stack and the second gate stack. For example, each of the middle, right, and left source regions is between (and may be in contact with) a first gate spacer of the first gate stack and a second gate spacer of the second gate stack. In an example, each of the first gate stack and the second gate stack may be continuous, while in another example, one or both of the first gate stack and the second gate stack may have one or more gate cuts to form discontinuous sections of a gate stack.

Channel regions extending from each of the middle, right, and left source regions towards the first gate stack can be wrapped around by the first gate stack, and channel regions extending from each of the middle, right, and left source regions towards the second gate stack can be wrapped around by the second gate stack. Some examples of this disclosure assume the devices to be GAA devices, e.g., where the gate stack wraps around a channel region. Note that an example of the channel region in a GAA device includes nanoribbons. As will be appreciated in light of this disclosure, reference to nanoribbons as channel regions is also intended to include other gate-all-around or multi-gate channel regions, such as nanowires, nanosheets, and other such semiconductor bodies around which a gate structure can wrap. To this end, the use of a specific channel region configuration (e.g., nanoribbon) is not intended to limit the present description to that specific channel configuration. Rather, the techniques provided herein can benefit any number of channel configurations, whether those bodies be nanowires, nanoribbons, nanosheets or some other body around which a gate structure can at least partially wrap (such as the semiconductor bodies of a forksheet device or a fin-based device).

Continuing with the above discussed example of the middle, right, and left source regions, each of the middle, right, and left source regions have corresponding middle, right, and left source contacts. The following discussion pertains to the middle source contact, and similar discussion also applies to the other source and drain contacts as well. In an example, as discussed above, the middle source contact has the lower section wrapped around by the middle source region. The middle source contact also has the upper section that doesn't extend within the middle source contact. The upper section of the middle source contact is adjacent to the previously discussed first gate spacer, the second gate spacer, the right ILD, and the left ILD. For example, the first gate spacer, the second gate spacer, the right ILD, and the left ILD form a space therebetween, and the upper section of the middle source region is self-aligned to this space. For example, an entire perimeter of the upper section of the middle source contact is adjacent to the first gate spacer, the second gate spacer, the right ILD, and the left ILD.

Figure 1B:
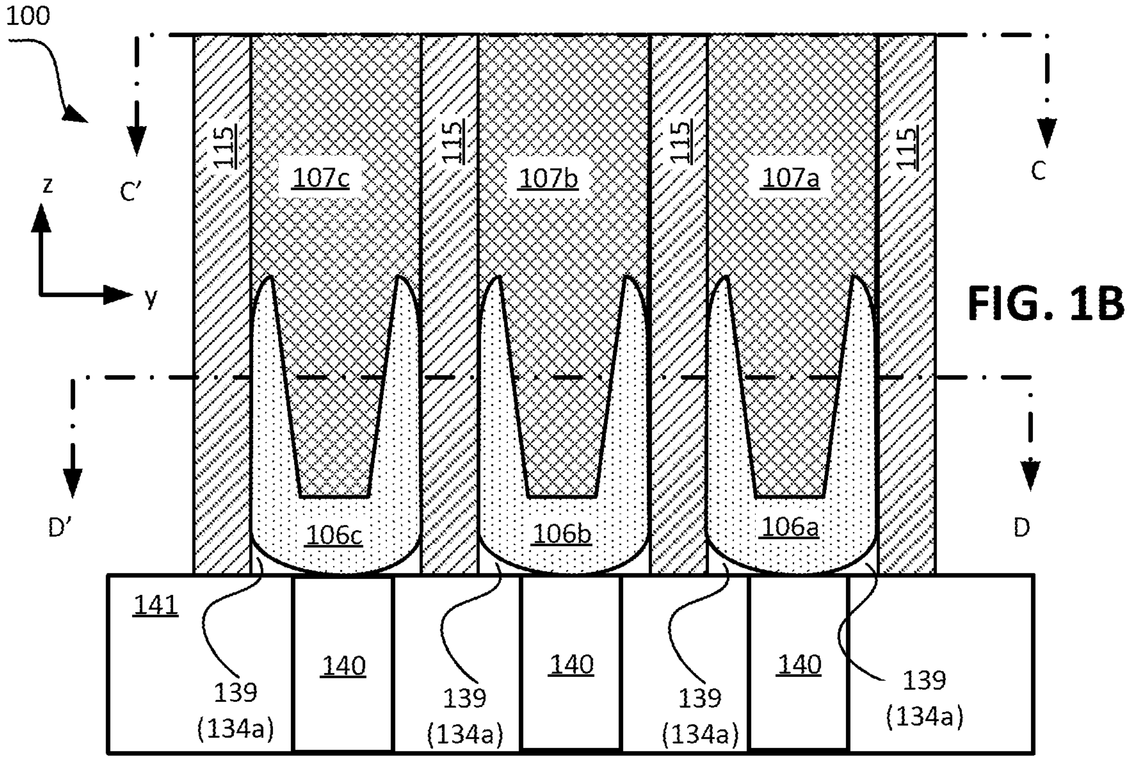
Figure 1C:
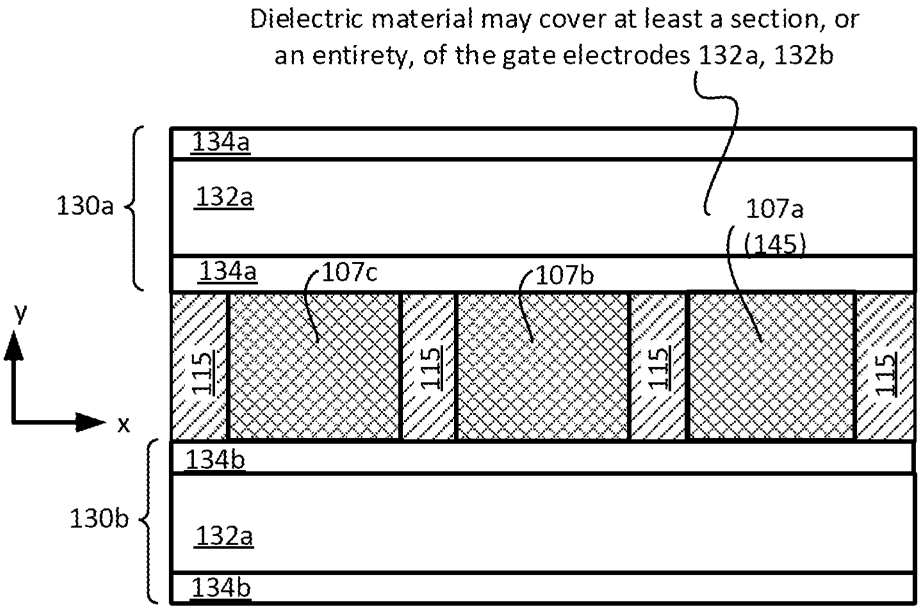

In an example, the upper section of the middle source contact is in contact with one or more (e.g., each) of the first gate spacer, the second gate spacer, the right ILD, and the left ILD (e.g., see FIGS. 1B and 1C). In another example, a liner layer is around the upper section of the middle source contact, and the liner layer separates the upper section of the middle source contact from the first gate spacer, the second gate spacer, the right ILD, and the left ILD (e.g., see FIGS. 1G1 and 1G2). The liner layer may be left behind from a process to form the source contacts.

As discussed herein later with respect to FIG. 1E in further detail, in some examples, a portion of the upper section of the middle source contact can be laterally between the middle source region and the right ILD, and another portion of the upper section of the middle source contact can be laterally between the middle source region and the left ILD. Thus, a lower surface of these portions of the upper section of the middle source contact is below an upper surface of the middle source region. For example, an imaginary horizontal line (e.g., line E-E' of FIG. 1E) passes through the right ILD, the two portions of the upper section of the middle source contact, the middle source region, the lower portion of the middle source contact, and the left ILD.

In an example, to form the above discussed source contacts, the devices are processed to form the middle, left, and right source regions, followed by releasing of the nanoribbons and forming the replacement gate stack. Thus, at this stage, except for the source and drain contacts (and possibly gate contacts as well), the devices comprising the middle, left, and right source regions are substantially formed. The following discussion pertains to forming the middle source contact, and similar processes may also be applied to form the other source and drain contacts as well.

The source trench of the middle source region is opened, e.g., by removing dielectric material covering the middle source region. The source trench has the previously discussed first gate spacer of the first gate stack, the second gate spacer of the second gate stack, the right ILD, and the left ILD on various sides of the source trench, and has the middle source region below the source trench. Note that the left and right ILDs (along with the first and second gate spacers) facilitate in formation of a confined space, within a part of which the source contact is to be eventually formed. If the left and/or right ILDs were not present, this might have resulted in the source trench of the middle source region being continuous with another adjacent source trench of an adjacent source region (e.g., see FIGS. 3Ga, 3Gb). The previously discussed liner layer is formed on sidewalls of the opening of the source trench, e.g., on walls of the first gate spacer, the second gate spacer, the right ILD, and the left ILD. Again, if the left and/or right ILDs were not present or their height is shorter than upper section of source region, formation of the liner layer on walls of the left and right ILDs may not have been possible, which could result in source contact metal only having physical contact with 2 sides of source region, e.g., with lesser contact-surface area and hence potentially higher contact resistance. Note that some portion of the liner layer may also initially be formed on entire top surface of the middle source region, and the horizontal component of the liner layer on a central section of the top surface of the middle source region may be selectively removed, as will be discussed herein in turn. Thus, the liner layer on sidewalls of the opening of the source trench covers peripheral section of the top surface of the middle source region (e.g., is above a perimeter of the top surface of the middle source region, see FIGS. 3F1 and 3F2). Thus, the liner layer narrows the opening to be over only a central section of the top surface of the middle source region. The middle source region is then selectively etched through this opening, such that the opening now extends within the middle source region (e.g., see FIGS. 3G2 and 3G3). In an example, the opening extends within, and not through the middle source region (FIG. 3G2), while in another example the opening extends through the middle source region (FIG. 3G3).

In one example, the liner layer is then removed (e.g., which results in eventual formation of the structure of FIGS. 1A-1D). However, in another example, the liner layer (or at least some remnants of the liner layer) may remain on sidewalls of the first gate spacer, the second gate spacer, the right ILD, and the left ILD (e.g., which results in eventual formation of the structure of FIGS. 1G1, 1G2).

Subsequently, the middle source contact is formed within the opening above the middle source region. As the opening extended within the middle source region, the lower portion of the middle source contact also correspondingly extends within the middle source region, while the upper portion of the middle source contact is outside the middle source region. In an example, top surface of the deposited conductive material of the middle source contact may be planarized using an appropriate planarization technique, such as mechanical polishing or chemical-mechanical polishing (CMP). This completes formation of middle source contact. Various other source and drain contacts may similarly be formed, e.g., at least in part simultaneously with formation of the middle source contact.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools be used to detect a contact extending within a corresponding source (or drain) region, such that an upper section of the contact is above the source (or drain) region, and a lower section of the contact extends within the source (or drain) region. For example, the source (or drain) region wraps around the lower section of the contact, such that an entire perimeter of the lower section of the contact is adjacent to the source (or drain) region. An upper section of the contact is adjacent to (i) a first gate spacer of a first gate stack, (ii) a second gate spacer of a second gate stack, (iii) a first ILD between the source (or drain) region and another laterally adjacent source (or drain) region, and (iv) a second ILD between the source (or drain) region and yet another laterally adjacent source (or drain) region. Numerous configurations and variations will be apparent in light of this disclosure.

Architecture

FIGS. 1A, 1B, 1C, and 1D illustrate various views of an integrated circuit structure 100 (also referred to herein as "structure 100") including a plurality of devices comprising (i) a plurality of source and drain regions and (ii) a corresponding plurality of source or drain contacts, where each source or drain contact at least in part extends within a corresponding source or drain region, such that a source or drain region wraps around a section of a corresponding source or drain contact, wherein laterally adjacent source or drain regions are separated by corresponding dielectric material 115 (generally referred to herein as interlayer dielectric material 115, or ILD 115), in accordance with an embodiment of the present disclosure.

Figure 1D:
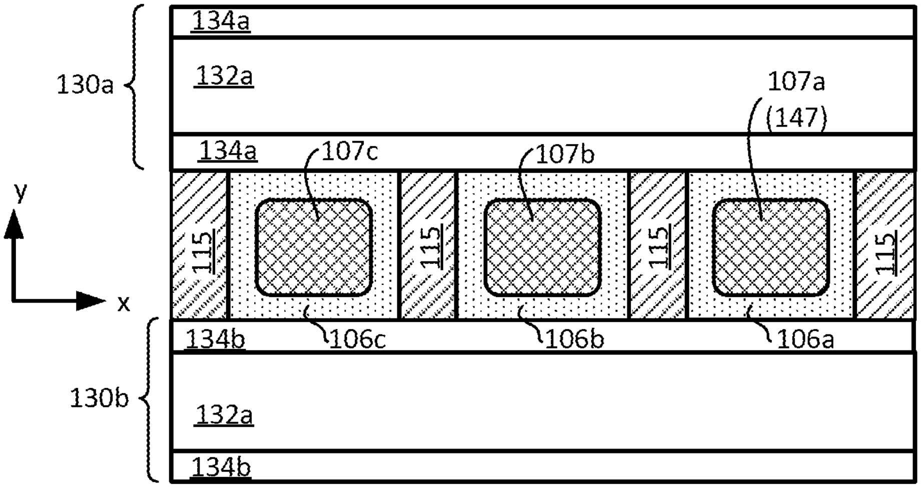

As can be seen, FIG. 1A is a perspective view of the structure 100, and FIG. 1B is a cross-sectional view taken parallel to a gate stack 130*a* and perpendicular to a channel region comprising nanoribbons 118. For example, the cross-sectional view of FIG. 1B is along a line B-B' of FIG. 1A, where the line B-B' passes through the source regions 106*a*, 106*b*, 106*c*, and corresponding source contacts 107*a*, 107*b*, 107*c*. FIG. 1C is a top-down view of the structure 100, e.g., along line C-C' of FIG. 1B. FIG. 1D is a top-down view of a section of the structure 100, e.g., along line D-D' of FIG. 1B. Thus, while FIG. 1C illustrates the top of the structure 100, FIG. 1D illustrates a top view of a mid-section of the structure 100.

Note that each of FIGS. 1C and 1D illustrate only corresponding sections, and not an entirety, of the structure 100. For example, these figures show the source regions 106*a*, 106*b*, 106*c*, corresponding source contacts 107*a*, 107*b*, 107*c*, respectively, and components (e.g., gate stacks 130*a*, 130*b*, and ILD 115) that are adjacent to the source regions and the source contacts.

It may be noted that FIG. 1A does not illustrates some components of the structure 100, e.g., a gate stack 130*b* (which includes gate spacer 134*b*, gate electrode 132*b*, e.g., similar to another gate stack 130*a* illustrated in FIG. 1A) over nanoribbons 118*a*2, 118*b*2, 118*c*2. Furthermore, shapes of the various source or drain regions and corresponding source or drain contacts illustrated in FIG. 1A are mere examples and may not match with the shapes of these components illustrated in FIGS. 1B-1D. FIG. 1A is primarily to illustrate relative positions of the various source or drain regions and the gate stacks 130*a*, 130*b*.

Note that the structure 100 includes two channel regions (see FIG. 1A) along with a source region and a drain region for each device 102*a*, 102*b*, 102*c*, but any number of channel regions and corresponding source and drain regions can be included, as will be appreciated. Further note that all devices shown in this example are contacted, but other examples may include dummy devices or devices that are not connected into the overall circuit. The semiconductor bodies 118 included in the channel regions of the devices can vary in form, but in this example embodiment are in the form of nanoribbons. In particular, the channel regions of each device in this example case include three nanoribbons 118. Other examples may include fewer nanoribbons per channel region (e.g., one or two), or more nanoribbons per channel region (e.g., four, five, or six). Still other embodiments may include other channel configurations, such as one or more nanowires, or nanosheets, or a fin or other semiconductor body, including both planar and nonplanar topologies. To this end, the present disclosure is not intended to be limited to any particular channel configuration or topology; rather the techniques provided herein can be used in any transistor architecture that uses laterally disposed transistor devices.

In the example of FIGS. 1A-1D, three devices 102*a*, 102*b*, and 102*c* are illustrated. Device 102*a* includes a source region 106*a* and a drain region 108*a*, a gate stack 130*a*, and a plurality of nanoribbons 118*a*1 laterally between the source region 106*a* and drain region 108*a*. Similarly, device 102*b* includes a source region 106*b* and a drain region 108*b*, the gate stack 130*a*, and a plurality of nanoribbons 118*b*1 laterally between the source region 106*b* and drain region 108*b*. Similarly, device 102*c* includes a source region 106*c* and a drain region 108*c*, the gate stack 130*a*, and a plurality of nanoribbons 118*c*1 laterally between the source region 106*c* and drain region 108*c*.

Although three laterally adjacent devices 102*a*, 102*b*, 102*c* are illustrate, the structure 100 may include fewer (such as one or two) or higher (such as four or higher) number of such laterally adjacent devices. Although FIG. 1A illustrates a continuous gate stack 130*a* wrapping around the channel regions of all three devices 102*a*, 102*b*, 102*c*, in an example, one or more gate cuts (e.g., comprising non-conductive or dielectric material) may divide the gate stack 130*a* in corresponding two or more discontinuous sections. For example, a gate cut in a section of the gate stack 130*a* that is between the devices 102*a* and 102*b* would divide the gate stack in (i) a first section wrapping around the nanoribbons 118*a*1 of the device 102*a*, and (ii) a second section wrapping around the nanoribbons 118*b*1 and 118*c*1 of the devices 102*b*, 102*c*, respectively.

In an example, the devices 102*a*, 102*c* are one of PMOS or NMOS devices, and the device 102*b* is the other of PMOS or NMOS devices. In one example, the devices 102*a*, 102*c* are PMOS devices, and the device 102*b* is an NMOS device. In another example, the devices 102*a*, 102*c* are NMOS devices, and the device 102*b* is a PMOS device.

As illustrated in FIG. 1A, the structure 100 further includes nanoribbons 118*a*2 laterally extending from the source region 106*a*, nanoribbons 118*b*2 laterally extending from the source region 106*b*, and nanoribbons 118*c*2 laterally extending from the source region 106*c*. A gate stack 130*b* (e.g., similar to the gate stack 130*a*) is formed to wrap around the nanoribbons 118*a*2, 118*b*2, 118*c*2, although the gate stack 130*b* is not illustrated in FIG. 1A for purposes of illustrative clarity (the gate stack 130*b* is illustrated in FIGS. 1C and 1D). In an example and although not illustrated in FIG. 1A, similar nanoribbons may also extend laterally from the drain regions 108*a*, 108*b*, 108*c*, away from the source regions 106. As illustrated, in an example, each source region 106*a*, 106*b*, 106*c* is laterally between the two gate stacks 130*a*, 130*b*.

In an example, the nanoribbons 118*a*2 are part of another device that is laterally adjacent to, and for example, in series with, the device 102*a*. Thus, part of the source region 106*a* of the device 102*a* acts as a drain region of the laterally adjacent device. Similar discussion applies for the other nanoribbons 118*b*1 and 118*c*2. Thus, the region 106*a* acts as a source region of the device 102*a*, and as a drain region of the laterally adjacent device. In some examples, individual ones of the source regions 106 and/or drain regions 108 may also be referred to as source or drain regions.

The nanoribbons 118*a*2 are illustrated to extend laterally from the source region 106*a*, and there may be a drain region (not illustrated in FIG. 1A) on the other end of the nanoribbons 118*a*2. Similarly, the nanoribbons 118*b*2 are illustrated to extend laterally from the source region 106*b*, and there may be a drain region (not illustrated in FIG. 1A) on the other end of the nanoribbons 118*b*2. Similarly, the nanoribbons 118*c*2 are illustrated to extend laterally from the source region 106*c*, and there may be a drain region (not illustrated in FIG. 1A) on the other end of the nanoribbons 118*c*2.

The source regions 106*a*, 106*b*, 106*c* of the devices 102*a*, 102*b*, 102*c*, respectively, are laterally adjacent, as illustrated. Similarly, the drain regions 108*a*, 108*b*, 108*c* of the devices 102*a*, 102*b*, 102*c*, respectively, are laterally adjacent to, as illustrated. In an example, an ILD 115 (shown as transparent in FIG. 1A, but shown with shadings in FIGS. 1B-1D) encapsulates various components of the structure 100. Thus, as illustrated in FIGS. 1B-1D, the ILD 115 is between the source regions 106*a* and 106*b*, and also between the source regions 106*b* and 106*c*. The ILD 115 comprises an appropriate dielectric material, such as silicon oxide, silicon nitride, and/or another appropriate nitride, oxide, carbide, oxycarbide, oxynitride, and/or oxycarbonitride.

In the example of FIG. 1B, bottom section of individual source region 106 has somewhat of an oval or spherical shape. Accordingly, a portion of the bottom section of a source region 106 may not fully occupy the area between two adjacent ILDs 115. Accordingly, in the example cross-sectional view of FIG. 1B, the gate spacer 134*a* is partially visible through a void 139 created adjacent to the bottom section of individual source regions 106. In another example, this void 139 may be filed with dielectric material, and the gate spacer 134*a* may not be visible in FIG. 1B. In yet another example, this void 139 may be occupied by the conductive material of the source contact 107. Note that the shape of individual source region 106 illustrated in FIG. 1B is a mere example, and the source regions may have another appropriate shape, such as a rectangular shape, and for some shapes of the source region, the void 139 may not be present in the structure 100 (e.g., the void 139 is filed with the source region 106).

Note that FIGS. 1B-1D illustrate various source regions 106*a*, 106*b*, 106*c*, and/or corresponding source contacts 107*a*, 107*b*, 107*c*. Locations of the source and drain regions may be interchanged. Various discussions herein with respect to the source regions and corresponding source contacts may also be applicable for the drain regions and corresponding drain contacts.

Although not illustrated, in an example, each source region 106*a*, 106*b*, 106*c* (generally referred to as source regions 106 in plural, and source region 106 in singular) may include a corresponding nucleation region adjacent to the corresponding nanoribbons 118, and an epitaxially formed main region adjacent to the nucleation region, where a doping concentration of the main region may be higher than that of the nucleation region. The drain regions 108*a*, 108*b*, 108*c* (generally referred to as drain regions 108 in plural, and drain region 108 in singular) may also include similar nucleation regions and main regions. In some examples, the nucleation regions may be absent. In an example, a source or drain region may also include a silicide, germanide, and/or germanosilicide, e.g., adjacent to a region abutting the corresponding source or drain contact. Thus, a central section of a source or drain region is separated a corresponding source or drain contact by a corresponding layer of silicide, germanide, and/or germanosilicide. Numerous source and drain configurations can be used, and the present disclosure is not intended to be limited to any particular ones.

In some example embodiments, the source and drain regions 106, 108 are epitaxial source and drain regions that are provided after the relevant portion of the fin or fin structure was isolated and etched away or otherwise removed. In other embodiments, the source/drain regions may be doped portions of the fin structure or substrate, rather than epi regions. In some embodiments using an etch and replace process, the epi source and drain regions are faceted and overgrown from a trench within insulator material (e.g., shallow trench isolation, or gate spacers 134*a*, 134*b* that deposits on the sides of the fin structure in the source and drain locations), and the corresponding source or drain contact structure lands on that faceted portion. Alternatively, in other embodiments, the faceted portion of epi source and drain regions can be removed (e.g., via chemical mechanical planarization, or CMP), and the corresponding source or drain contact structure lands on that planarized portion.

The source and drain regions can be any suitable semiconductor material and may include any dopant scheme. In an example, source and drain regions can be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. Source and drain regions can be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. Example n-type dopants include phosphorus, bismuth, antimony, arsenic, lithium, and tellurium. In one specific embodiment, PMOS source and drain regions are boron-doped SiGe, and NMOS source and drain regions are phosphorus-doped silicon. In a more general sense, the source and drain regions can be any semiconductor material suitable for a given application.

In some cases, the epi source and drain regions may include a multilayer structure, such as a germanium cap on a SiGe body, or a germanium body and a carbon-containing SiGe spacer or liner between the corresponding channel region and that germanium body. In any such cases, a portion of the epi source and drain regions may have a component that is graded in concentration, such as a graded germanium concentration to facilitate lattice matching, or a graded dopant concentration to facilitate low contact resistance. Any number of source and drain configurations can be used as will be appreciated, and the present disclosure is not intended to be limited to any particular such configurations.

As illustrated in FIGS. 1A-1D, in each source or drain region 106 or 108, a corresponding source or drain contact at least in part extends within the source or drain region. For example, source contact **107*a* extends within the source region 106*a*, source contact 107*b* extends within the source region 106*b*, and source contact 107*c* extends within the source region 106*c*. Thus, as illustrated in FIG. 1B, a lower section of a source contact 107 extends within a corresponding source region 106, and the source region 106 wraps around the lower section of the source contact. For example, the source region 106 is around all sidewalls or side surfaces of the lower section of the source contact 107, as illustrated in FIGS. 1B and 1D. For example, an entire perimeter of the lower section of the source contact 107*a* is adjacent to the corresponding source region 106*a***.

Figure 1E:
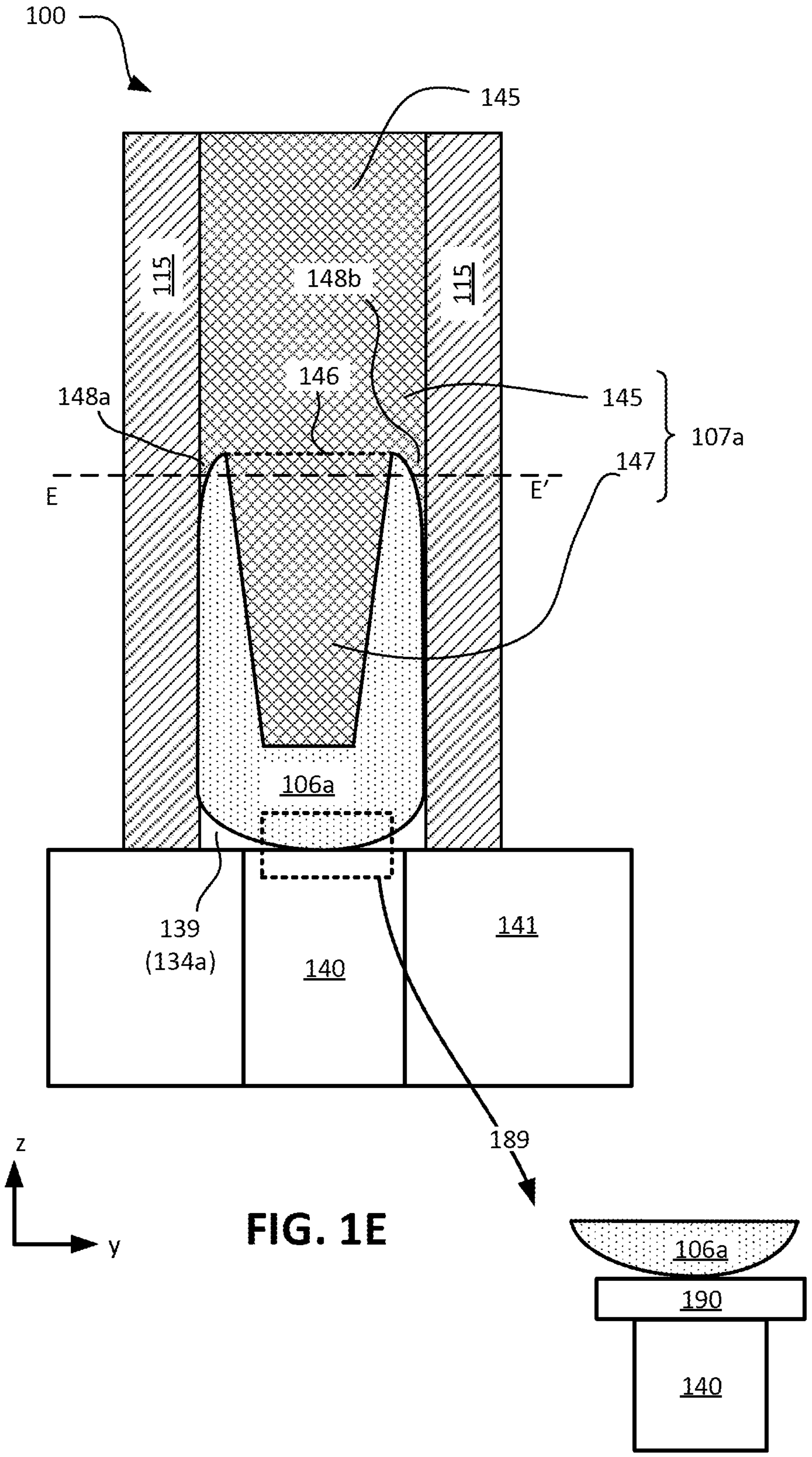
FIG. 1E illustrates a magnified view of a source contact of the integrated circuit structure of FIGS. 1A-1D extending within a corresponding source region, in accordance with an embodiment of the present disclosure.

FIG. 1E illustrates a magnified view of a source contact **107*a* of the integrated circuit structure 100 of FIGS. 1A-1D extending within a corresponding source region 106*a*, in accordance with an embodiment of the present disclosure. The discussion with respect to the source contact 107*a* also applies to other source and drain contacts discussed herein. As illustrate in FIG. 1E, the source contact 107*a* comprises a first or upper portion 145 outside the source region 106*a*, and a second or lower portion 147 extending within the source region 106*a*. Note that the two portions 145 and 147 comprise a continuous and monolithic body of conductive material, without any seam or interface therebetween. An approximate boundary 146 between the portions 145, 147 is illustrated using a dotted line. The portion 145 is at least in part above the portion 147**.

As illustrated, the source region **106*a* wraps around the portion 147 of the source contact 107*a*. For example, the source region 106*a* is around all sidewalls or side surfaces of the portion 147 of the source contact 107*a*. For example, an entire perimeter of the lower section of the source contact 107*a* is adjacent to the corresponding source region 106*a*. For example, the entire perimeter of the lower section 147 of the source contact 107*a* is in contact with the source region 106*a*. Note that the conductive materials of the lower section 147 and the source region 106*a* may have some intervening layers therebetween, such as one or more layers of silicide, germanide, and/or germanosilicide, and/or one or more adhesive layers, although these layers may be considered to be a part of the source region 106*a* or the source contact 107*a*. Note that the top-down view of FIG. 1D shows the lower section 147 of the source contact 107*a* and also shows the source region 106*a* wrapping around the lower section 147 of the source contact 107*a***.

As illustrated in this example, a section **148*a* and another section 148*b* of the portion 145 extend below a top surface of the source region 106*a* and boundary 146. For example, the space occupied by the sections 148*a*, 148*b* of the source contacts were initially occupied by a liner layer (discussed herein later with respect to method 200 for forming the source contacts), and after the liner layer is removed, this space is filled and occupied by the sections 148*a*, 148*b* of the portion 145 of the source contact 107*a*. Thus, there is a downward step function or inverted peak in the metal of the source contact 107*a*, generally adjacent or near boundary 146. In more detail, each of the sections 148*a* and 148*b* is laterally between the source region 106*a* and the corresponding ILD 115. One such example is shown here, wherein an imaginary horizontal line E-E' passes through the ILD 115 on the left side of FIG. 1E, the section 148*a* of the upper portion 145 of the source contact 107*a*, a first portion of the source region 106*a*, the lower portion 147 of the source contact 107*a*, a second portion of the source region 106*a*, the section 148*b* of the upper portion 145 of the source contact 107*a*, and the ILD 115 on right side of FIG. 1E. In other examples, sections 148*a* and 148*b* may be offset from one another, wherein one is higher than the other, so the imaginary line E-E' doesn't pass through both 148*a* and 148*b***.

The top-down view of FIG. 1C shows the upper section 145 of the source contact **107*a*. Referring to FIGS. 1C and 1E, the upper section 145 of the source contact 107*a* is adjacent to the gate stack 130*a* (e.g., the gate spacer 134*a* of the gate stack 130*a*), the ILD 115, and the gate stack 130*b* (e.g., the gate spacer 134*b* of the gate stack 130*b*). In the example of FIG. 1C, the upper section 145 of the source contact 107*a* is in contact with the gate spacers 134*a*, 134*b* and the ILD 115. In contrast, as will be discussed herein later with respect to FIGS. 1G1 and 1G2, in another example, the upper section 145 of the source contact 107*a* is adjacent to the gate spacers 134*a*, 134*b* and the ILD 115, and separated from the gate spacers 134*a*, 134*b* and the ILD 115 by a liner layer 170. The gate spacers 134*a*, 134*b* and the ILD 115, in combination, warp around the upper section 145 of the source contact 107*a*, see FIGS. 1C, 1G1, 1G2, and 1E**.

In an example, the structure 100 is formed on a substrate 141, which includes sub-fin regions 140 above which the fins and the source or drain regions are formed (e.g., sacrificial materials of the fins are selectively removed, to form the stack of nanoribbons 118). In an example, the sub-fin regions 140 may be absent under the source or drain regions 106, 109. In an example, the source or drain regions 106, 109 may be separated from the corresponding sub-fin regions 140 by corresponding one or more layers of dielectric material 190, e.g., as illustrated in an expanded view of a section 189 of FIG. 1E. In another example, the source or drain regions 106, 109 may be in contact with the corresponding sub-fin regions 140 (e.g., the dielectric material 190 of FIG. 1E is absent), as illustrated in FIG. 1A.

Figure 1F:
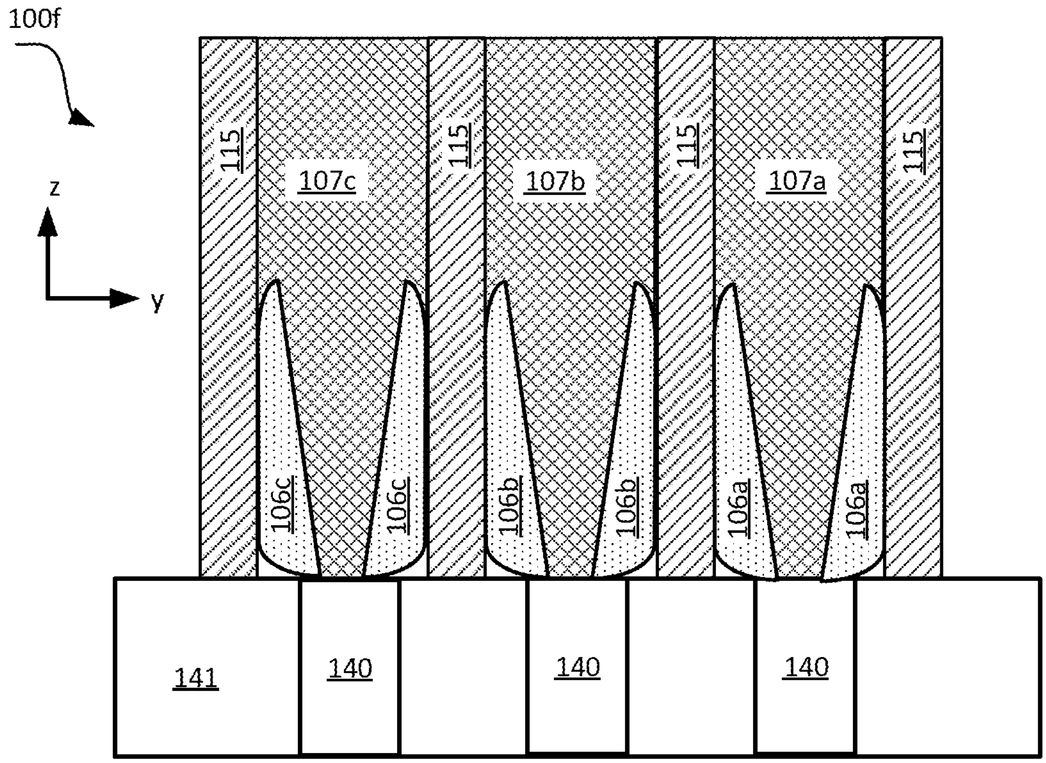
FIG. 1F illustrates an integrated circuit structure that is at least in part similar to the integrated circuit structure of FIGS. 1A-1D, where each source or drain contact extends fully through a corresponding source or drain region, in accordance with an embodiment of the present disclosure.

In FIGS. 1B and 1E, individual source contact extends within, but not fully through the corresponding source region. However, a source contact may fully extend through a corresponding source region, as illustrated in FIG. 1F. FIG. 1F illustrates an integrated circuit structure **100*f* that is at least in part similar to the integrated circuit structure 100 of FIGS. 1A-1D, where each source or drain contact extends fully through a corresponding source or drain region, in accordance with an embodiment of the present disclosure. For example, each source contact 107 is in contact with a sub-fin region 140 that is below the source region 106**.

Figure 2:
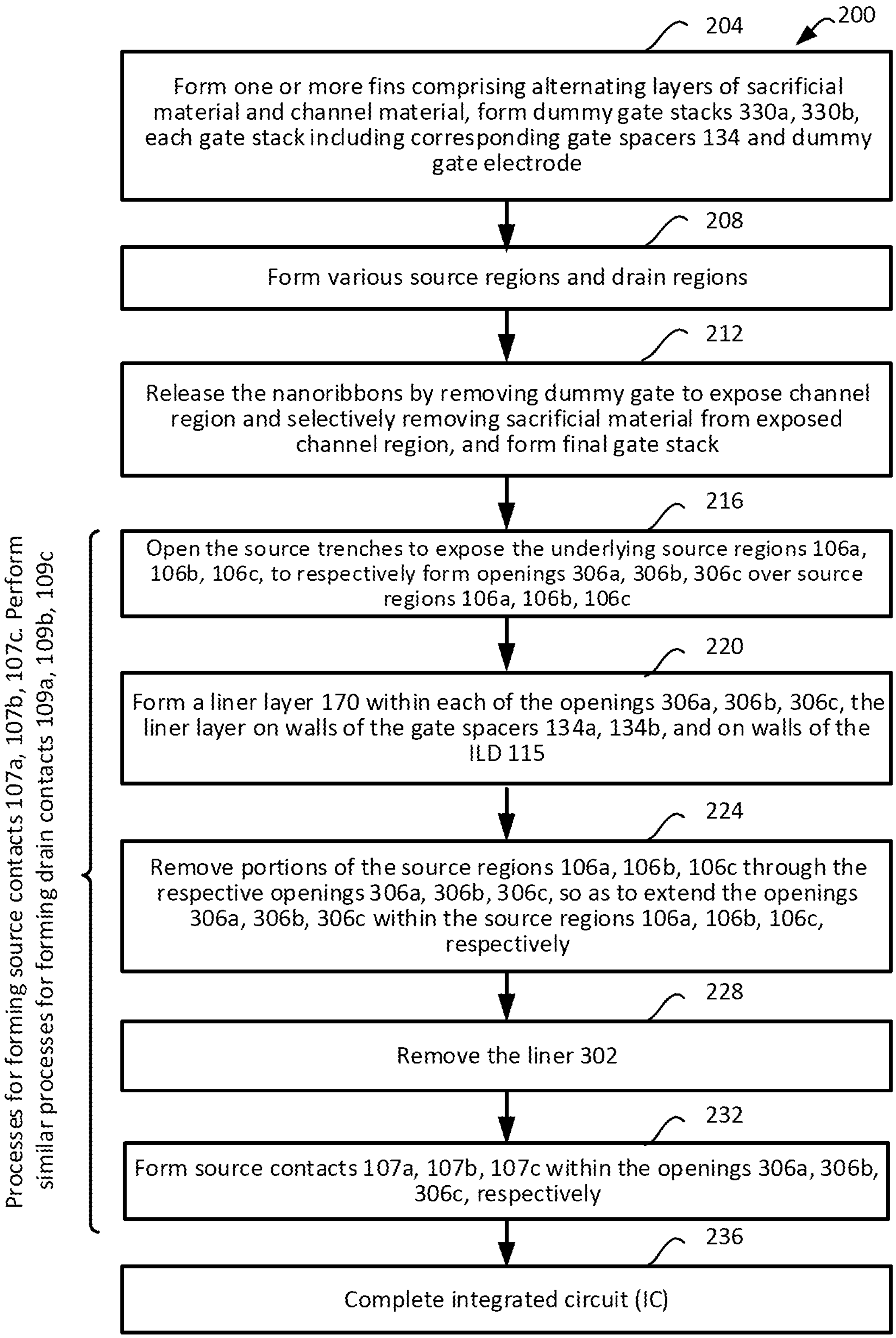
Figure 3G:
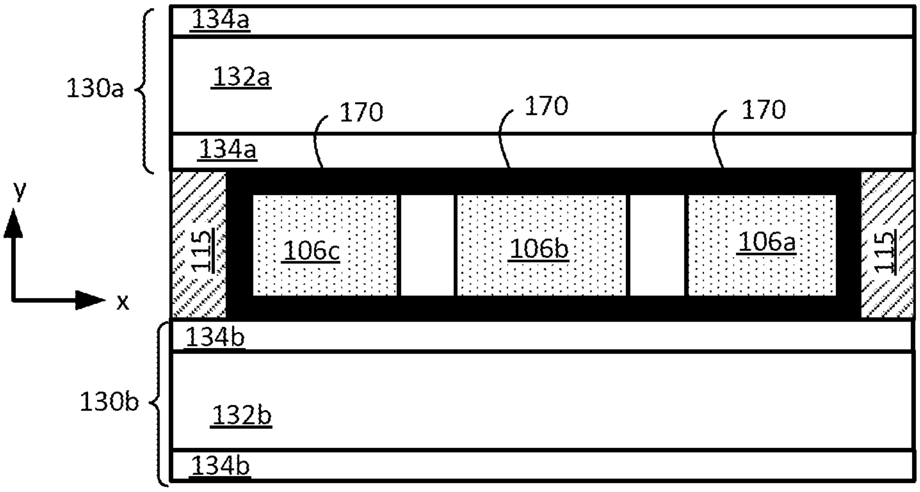
Figure 3G:
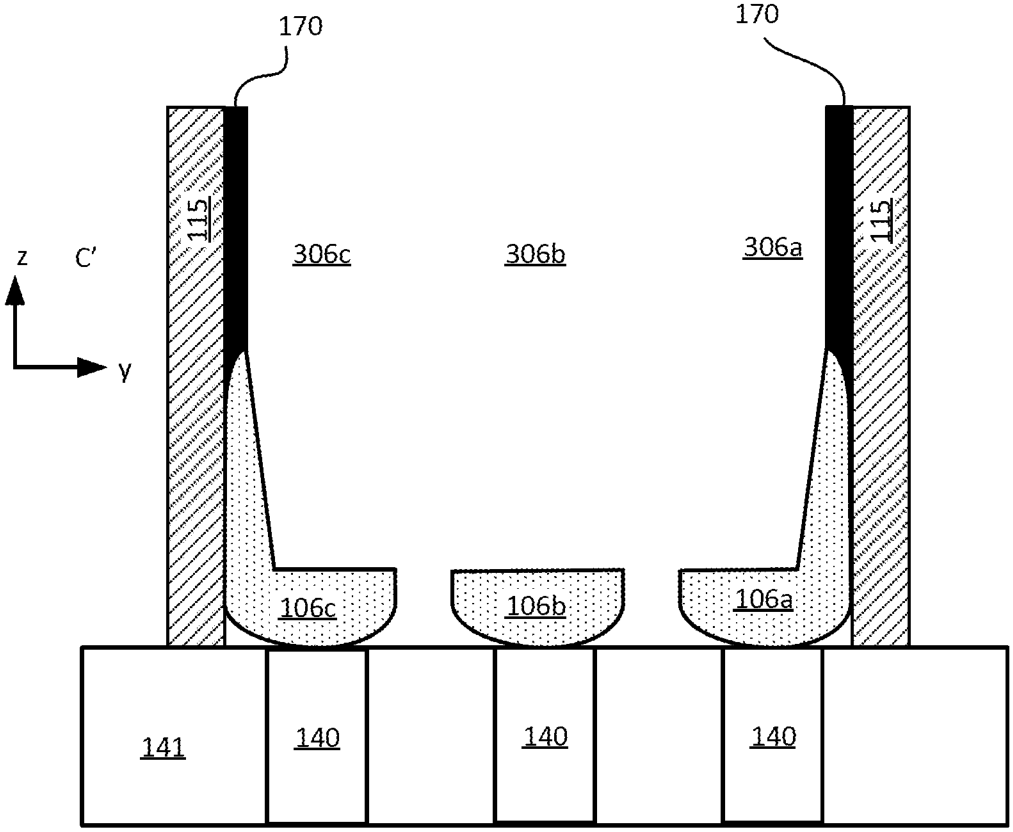

FIGS. 1G1 and 1G2 illustrate various views of an integrated circuit structure 100*g* that is at least in part similar to the integrated circuit structure 100 of FIGS. 1A-1D, where upper portions of each source or drain contact is surrounded by (e.g., wrapped around by) a liner layer 170, in accordance with an embodiment of the present disclosure. FIG. 1G1 is a cross-sectional view of the structure 100*g*, e.g., similar to the view of FIG. 1B. FIG. 1G2 is a top-down view of the structure 100*g* along line C-C' of FIG. 1G1, e.g., similar to the view of FIG. 1C. As illustrated, a liner layer 170 separates each source contact 107 from adjacent gate spacers 134*a*, 134*b*, and also separates each source contact 107 from adjacent ILD 115. Note that a liner layer 170 is used for forming a recess within a corresponding source region 106 (discussed with respect to method 200 herein in turn), and in an example, the liner layer 170 may not be removed (or may be only partially removed), resulting in the structure 100*g* of FIGS. 1G1 and 1G2. In such cases, further note that sections 148*a* and 148*b* (discussed herein previously with respect to FIG. 1E) will be filled with liner layer 170 material rather than contact 107 material, but the previously relevant description is similarly applicable here. In contrast, in another example, substantially complete removal of the liner layer 170 may result in the structure 100 of FIGS. 1A-1D.

Referring again to FIGS. 1A-1D, drain contact 109*a* extends within the drain region 108*a*, drain contact 109*b* extends within the drain region 108*b*, and drain contact 109*c* extends within the drain region 108*c*. The drain contacts 109 have structure that are similar to the above discussed structures of the source contacts 107.

In one embodiment, the gate structure 130*a* wraps around each of the nanoribbons 118*a*1, 118*b*1, 118*c*1 in the corresponding channel regions, and the gate structure 130*b* (not illustrated in FIG. 1A) wraps around each of the nanoribbons 118*a*2, 118*b*2, 118*c*2 in the corresponding channel regions. The gate stack 130*a* is discussed herein below in further detail, and such discussion also applies to the gate stack 130*b* that may have a similar structure.

The gate stack 130*a* comprises gate spacers 134*a* and gate electrode 132*a*. In one example the gate spacers 134*a* may be considered part of the gate stack 130*a*, whereas in another example the gate spacers 134*a* may be considered external to the gate stack 130*a*. The gate spacers 134*a* isolate the gate electrode 132*a* from contacting the source regions 106*a*, 106*b*, 106*c* and from contacting the drain regions 108*a*, 108*b*, 108*c*. In other embodiments, there may be other insulator layers (e.g., interlayer dielectric) that prevent such contact, whether in addition to the gate spaces 134*a*, or in place of the gate spacers 134*a*.

Although not illustrated in FIGS. 1A-1D, a conductive gate contact may provide contact to the gate stack 130*a*. For example, as mentioned in FIG. 1C, dielectric material may cover at least a section, or an entirety, of the gate electrodes 132*a*, 132*b*. The conductive gate contact may extend through such dielectric material, to contact a gate electrode 132. Note that the dielectric material covering the gate electrodes 132*a*, 132*b* are not illustrated in the top-down view of FIG. 1C.

The gate stack 130*a* can be formed via gate-first or gate-last processing, and may include any number of suitable gate materials and configurations. In an example, the gate stack 130*a* includes the gate spacers 134*a*, the gate electrode 130*a*, and gate dielectric 120 between the gate electrode 130*a* and individual nanoribbons 118*a*1, 118*b*1, 118*c*1. Note that the gate dielectric material 120 is illustrated in a cross-sectional view of an example nanoribbon 118*c*2 in FIG. 1A, which shows the gate dielectric material 120 wrapping around the example nanoribbon 118*c*2.

In an example, the gate electrode 132*a* may include any sufficiently conductive material, such as a metal, metal alloy, or doped polysilicon. The gate electrodes 132*a* may include a wide range of materials, such as polysilicon or various suitable metals or metal alloys, such as aluminum, tungsten, titanium, tantalum, copper, cobalt, molybdenum, titanium nitride, or tantalum nitride, for example.

In one embodiment, one or more work function materials (not illustrated in the FIGS. 1A-1D) may be included around the nanoribbons 118. Note that work function materials are called out separately, but may be considered to be part of the gate electrodes. In this manner, a gate electrode may include multiple layers or components, including one or more work function materials, gate fill material, capping or resistance-reducing material, to name a few examples. In some embodiments, a p-channel device may include a work function metal having titanium, and an n-channel device may include a work function metal having tungsten or aluminum, although other material and combination may also be possible. In some other embodiments, the work function metal may be absent around one or more nanoribbons 118. In still other embodiments, there may be insufficient room for any gate fill material, after deposition of work function material (i.e., a given gate electrode may be all work function material and no fill material). Numerous gate structure configurations can be used along with the techniques provided herein, and the present disclosure is not intended to be limited to any particular such configurations.

The gate dielectric material 120 (shown around an example nanoribbon in FIG. 1A) warps around middle section of individual nanoribbons 118 (note that end sections of individual nanoribbons 118 are wrapped around by the gate spacers). The gate dielectric material 120 is between individual nanoribbons 118 and corresponding gate electrode 132*a*. In an example, due to conformal deposition of the gate dielectric material 120, the gate dielectric material 120 may also be on inner sidewalls of the gate spacers 134*a*.

The gate dielectric 120 may include a single material layer or multiple stacked material layers. The gate dielectric may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. The high-k dielectric material (e.g., hafnium oxide) may be doped with an element to affect the threshold voltage of the given semiconductor device. According to some embodiments, the doping element used in gate dielectric 120 is lanthanum. In some embodiments, the gate dielectric can be annealed to improve its quality when high-k dielectric material is used. In some embodiments, the gate dielectric 120 includes a first layer (e.g., native oxide of nanoribbons, such as silicon dioxide or germanium oxide or SiGe-oxide) on the nanoribbons, and a second layer of high-k dielectric (e.g., hafnium oxide) on the first layer.

The semiconductor bodies 118*a*1, 118*b*1, 118*c*1, 118*a*2, 118*b*2, 118*c*2, which in this case are nanoribbons, can be any number of semiconductor materials as well, such as group IV material (e.g., silicon, germanium, or SiGe) or group III-V materials (e.g., indium gallium arsenide). In other embodiments, the semiconductor bodies 118 may be fins on which the corresponding gate structures are formed to provide double-gate or tri-gate configurations (as opposed to gate-all-around configurations with nanoribbons or wires). The semiconductor bodies 118 may be lightly doped, or undoped, and may be shaped or sculpted during the gate formation process, according to some embodiments. In some cases, semiconductor bodies 118 may be a multilayer structure, such as a SiGe body cladded with germanium, or a silicon body cladded with SiGe. Any number of channel configurations can be used.

FIG. 2 illustrates a flowchart depicting a method 200 of forming the example semiconductor structure 100 of FIGS. 1A-1D, in accordance with an embodiment of the present disclosure. FIGS. 3A1, 3A2, 3B1, 3B2, 3C1, 3C2, 3D1, 3D2, 3E1, 3E2, 3F1, 3F2, 3G1, 3G2, 3Ga, 3Gb, 3G3, 3H1, 3H2, 3I1, and 3I2 collectively illustrate various views of an example semiconductor structure (e.g., the semiconductor structure 100 of FIGS. 1A-1D) in various stages of processing, in accordance with an embodiment of the present disclosure. FIGS. 2 and 3A1-3I2 will be discussed in unison.

The views of FIGS. 3A1, 3B1, 3C1, 3D1, 3E1, 3F1, 3G1, 3H1, and 3I1 correspond to top-down views, e.g., similar to that of FIG. 1C (e.g., along line C-C' of FIG. 1). The views of FIGS. 3A2, 3B2, 3C2, 3D2, 3E2, 3F2, 3G2, 3G3, 3H2, and 3I2 correspond to cross-section views, e.g., similar to that of FIG. 1B (e.g., along line B-B' of FIG. 1A).

Referring to FIG. 2, the method 200 includes, at 204, forming a plurality of fins comprising alternating layers of sacrificial material and channel material, and forming dummy gate stacks 330*a*, 330*b*, each gate stack 330 including corresponding gate spacers 134 and dummy gate electrode 332, e.g., as illustrated in FIGS. 3A1 and 3A2. FIG. 3A1 is a top-down view of the structure after process 204, e.g., along line C-C' of the cross-sectional view of FIG. 3A2. As illustrated in the top-down view of FIG. 3A1, dummy gate stack 330*a* includes the gate spacers 134*a* and dummy gate electrode 332*a* (e.g., comprising polysilicon or another appropriate material used for dummy gate electrode), and dummy gate stack 330*b* includes the gate spacers 134*b* and dummy gate electrode 332*b*. In an example, to form the gate spacers 134, after source drain trenches are formed, a selective isotropic etch is used to laterally recess the sacrificial material of the fins, and then spacer material is deposited in those recesses, to form the gate spacers 134. Excess spacer material can be removed with a selective etch. Note that at this stage, the source and drain regions have not been formed yet. So, in the top-down view of FIG. 3A1, 305 denotes a space reserved for the source regions 106*a*, 106*b*, 106*c* and corresponding source contacts. The space 305 may be void (e.g., as the source trenches have already been opened, to form the gate spacers 134). Accordingly, in the cross-sectional view of FIG. 3A2, the gate spacer 134*a* are visible through the void of the source trenches.

Referring again to FIG. 2, the method 200 then proceeds from 204 to 208, where various source and drain regions are formed. For example, FIGS. 3B1 and 3B2 illustrate the structure after formation of the various source and drain regions. Referring to FIGS. 3B1 and 3B2, illustrated are the source regions 106*a*, 106*b*, 106*c*. Dielectric material 315 may be over the source regions 106*a*, 106*b*, 106*c*, e.g., covering the source trenches. As illustrated in FIG. 3B1, at this stage, the dummy gate electrodes 332*a* and 332*b* have not yet been removed. In an example, the source and drain regions can be formed via epitaxial growth. Note in this example of FIG. 3B1, each of the source regions includes a fully merged epitaxial structure, in that the epitaxial deposition grew from both the left and right nanoribbons to meet and merge to provide an overall diffusion region. In other embodiments, the epitaxial growth may be timed to not merge, such that there is a space between the two epitaxial growths, so the resulting structure would look similar to that shown in FIG. 3H2. That is, in such case, the two epitaxial regions would be unmerged, with the opening 306 of FIG. 3H2 between the two epitaxial regions. In such example cases, no recessing of the source regions (discussed with respect to FIGS. 3F1-3H2) would be needed, and processes 220 and 224 of method 200 may be skipped.

As discussed herein previously, some of the devices 102*a*, 102*b*, 102*b* are PMOS devices, and the other of the devices 102*a*, 102*b*, 102*c* are NMOS devices. The doping profile and/or the material of the source and drain regions and/or the nanoribbons of a specific device may be in accordance with the type of the device. For example, source and drain regions of the PMOS device may include, for example, group IV semiconductor materials such as silicon, germanium, SiGe, germanium tin (GeSn), SiGe alloyed with carbon (SiGe:C). Example p-type dopants include boron, gallium, indium, and aluminum. Source and drain regions of the NMOS device may include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In one specific embodiment, PMOS source and drain regions are boron-doped SiGe, and NMOS source and drain regions are phosphorus-doped silicon. In a more general sense, the source and drain regions can be any semiconductor material suitable for a given application.

Referring again to FIG. 2A, the method 200 then proceeds from 208 to 212, where the nanoribbons are released by removing the dummy gate to expose channel region and the sacrificial material are selectively removed from the exposed channel region, and the final gate stacks 130*a* and 130*b* are formed. FIGS. 3C1 and 3C2 illustrate the structure after removal of the dummy gate stack and releasing the nanoribbons, and FIGS. 3D1 and 3D2 illustrate the structure after formation of the final gate stacks 130*a*, 130*b*.

Referring to FIGS. 3C1 and 3C2, the dummy gates 332*a*, 332*b* have been removed and the nanoribbons 118 released, and hence, the various nanoribbons 118 are visible through the gate trench formed by removal of the dummy gates. Note that end sections of individual nanoribbons are wrapped around by respective gate spacers 134*a*, 134*b*, and hence, the end sections are illustrated using dotted lines in the top-down view of FIG. 3C1.

Referring to FIGS. 3D1 and 3D2, the final gate stack 130*a* includes the gate electrode 132*a* formed between the two gate spacers 134*a* and wrapping around individual nanoribbons 118*a*1, 118*b*1, 118*c*2, and also includes dielectric material 120 (see FIG. 1A) between the gate electrode 132*a* and individual nanoribbons 118*a*1, 118*b*1, 118*c*2. Gate stack 130*b* also has similar structure. Note that the nanoribbons, which were visible in the top-down view of FIG. 3C1, are no longer visible in the top-down view of FIG. 3D1 (e.g., as the gate trenches are now filled by the corresponding gate electrodes 132*a*, 132*b*). After the process 212, a major portion of the devices 102*a*, 102*b*, 102*c*, except, for example, the respective source and drain contacts, are formed. As illustrated in FIGS. 3D1 and 3D2, after process 212, the source and drain contacts of the devices have not yet formed, the source and drain regions of individual devices are still covered by respective dielectric material 315.

Referring again to FIG. 2, the method 200 then proceeds from 212 to 216, where the source trenches are opened (e.g., by removing dielectric material 315 from above the source regions), to expose the underlying source regions 106*a*, 106*b*, 106*c*, as illustrated in FIGS. 3E1, 3E2. As a result, an opening 306 is formed above each of the source regions 106*a*, 106*b*, 106*c*.

Note that processes 216 to 232 are discussed with respect to forming the source contacts 107*a*, 107*b*, 107*c* for the source regions 106*a*, 106*b*, 106*c*, respectively. Similar processes may be performed in parallel for forming the drain contacts 109*a*, 109*b*, 109*c* for the drain regions 108*a*, 108*b*, 108*c*, respectively.

Referring again to FIG. 2, the method 200 then proceeds from 216 to 220, where a liner layer 170 is formed within each of the openings 306*a*, 306*b*, 306*c*, where the liner layer 170 is on walls of the gate spacers 134*a*, 134*b*, and on walls of the ILD 115, as illustrated in FIGS. 3F1 and 3F2. For example, the liner layer 170 may initially be deposited on walls of the gate spacers 134*a*, 134*b* and ILD 115 and also above the individual source region 106 (e.g., using an appropriate deposition technique, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example). Subsequently, the horizontal section of the liner layer 170 above individual source regions 106 may be selectively etched and removed using any appropriate techniques, such that the liner layer 170 remains on walls of the gate spacers 134*a*, 134*b* and ILD 115, as illustrated in FIGS. 3F1 and 3F2. Although not illustrated, in an example, the liner layer 170 may also be deposited on top surfaces of the ILD 115 and/or the top surfaces of the gate spacers 134*a*, 134*b* (as well as may also be deposited on top surfaces of the gate electrodes 132*a*, 132*b*).

Comparing FIGS. 3E1, 3E2 with FIGS. 3F1, 3F2, a size of individual openings 306*a*, 306*b*, 306*c* is reduced, due to formation of the liner layer 170. Thus, the liner layer 170 further defines the openings 306. The opening size can be modulated by controlling the thickness of the liner layer 170. Note that the size of, for example, the opening 306*a* in turn dictates a size (e.g., width) of the lower portion 147 (see FIG. 1E). Thus, the width of the lower portion 147 of the source contact 107*a* can be controlled by controlling a thickness of the liner layer 170.

In an example, the liner layer 170 is etch selective with respect to the material of the source regions 106*a*, 106*b*, 106*c*. For example, an etch process that etches the source regions may not substantially etch (or etch at a substantially slower rate) the liner layer 170, and an etch process that etches the liner layer 170 may not substantially etch (or etch at a substantially slower rate) the source regions. In an example, the liner layer 170 comprises titanium nitride, silicon nitride, and/or another appropriate nitride, oxide, carbide, oxycarbide, oxynitride, and/or oxycarbonitride.

As will be seen herein later in turn, the liner layer 170 protects the gate spacers 134 and peripheral sections of individual source regions (and may also protect the gate electrodes 132*a*, 132*b*, if the liner layer 170 is deposited above the gate electrodes as well), when a recess for a source contact is formed within each of the source regions. In an example, the liner layer 170 may subsequently be removed (e.g., in FIGS. 1A-1D), and hence comprises a sacrificial material. In another example, at least some sections of the liner layer 170 may not be removed, e.g., in FIGS. 1G1 and 1G2.

Referring again to FIG. 2A, the method 200 then proceeds from 220 to 224, where portions of the source regions 106*a*, 106*b*, 106*c* are removed through the respective openings 306*a*, 306*b*, 306*c*, so as to extend the openings 306*a*, 306*b*, 306*c* within the source regions 106*a*, 106*b*, 106*c*, respectively, as illustrated in FIGS. 3G1, 3G2 (and also FIG. 3G3). For example, FIG. 3G2 illustrates each opening 306 extending within respective source region 106. An anisotropic and/or directional etch can be performed, to extend an opening 306 within a central section of a corresponding source region 106, with the liner layer 170 protecting the peripheral sections of the source region 106 that are not etched. The etch process is selective to the liner layer 170, such that a rate of etching the source regions 106*a*, 106*b*, 106*c* is substantially faster than a rate of etching the liner layer 170. Accordingly, after the etch process 224, the liner layer 170 continues to cover the walls of the gate spacer 134 and the ILD 115.

In an example, the etch process may be timed, so that an opening 306 extends partially, but not fully through the corresponding source region, as illustrated in FIG. 3G2. In another example, the etch process may be prolonged, so that the opening 306 extends fully through the corresponding source region, as illustrated in FIG. 3G3. In FIG. 3G3, the substrate 141 may act as an etch stop layer. Note that the partial extension of the openings 306 within respective source regions 106, as illustrated in FIG. 3G2, results in the structure 100 of FIGS. 1A-1D. In contrast, the full extension of the openings 306 within respective source regions 106, as illustrated in FIG. 3G3, results in the structure 100*f* of FIG. 1F.

In an example, the portion of individual openings 306 extending within respective source regions 106 may be slightly tapered (e.g., a lower section of an opening 306 near a bottom surface of the corresponding source region 106 has a lower diameter than an upper section of the opening 306 near a top surface of the source region 106). This may be a consequence of etching a deep opening 306 within the source region. However, in another example, the openings 306 may be substantially non-tapered.

As illustrated, a section of an opening 306, which extends within the corresponding source region 106, is surrounded on all sides by the source region (e.g., wrapped around by the source region). A bottom section of the opening 306 may be on the source region 106 (e.g., in FIG. 3G2) or on the substrate 141 (e.g., in FIG. 3G3).

Referring to an example opening 306*b* in FIGS. 3G1 and 3G2, there is ILD 115 on the left, ILD 115 on the right, and gate spacers 134*a* and 134*b* on two other sides of the opening 306*b*. The liner layer 170 is on walls of the gate spacers 134*a*, 134*b*, and on walls of the ILD 115, as illustrated in FIGS. 3G1 and 3G2. Thus, the ILDs 115 (along with the gate spacers) facilitate in formation of a confined space, within a part of which the source contact is to be eventually formed. If the ILDs were not present, this might have resulted in the opening 306*b* laterally extending and being in contact with one or both the adjacent openings 306*a* and/or 306*c*. Thus, relatively tall ILDs 115 (e.g., extending above the upper section of source region) facilitate in confining the source contacts. For example, FIGS. 3Ga and 3Gb illustrate the ILD 115 being absent between adjacent source regions 106*a*, 106*b*, 106*c*. Accordingly, the liner layer 170 is on walls of the of gate spacers 134*a*, 134*b*, and the openings 306*c*, 306*b*, and 306*a* are continuous and connected to each other. This results in the source regions 106*a*, 106*b*, and 106*c* to be at least partly (or completely) recessed in a direction parallel to the gate spacers 132*a* and 132*b*. This recessing of the source regions may also occur if ILDs 115 are relatively short, e.g., shorter than an upper section of source region. For example, such short ILDs 115 may not be able to provide the additional surface for liner layer 170 deposition on sidewall. In various examples discussed herein, the ILD 115 facilitates physical separation of the adjacent source contacts and helps in confining source contact within source region and enable source metal to have physical interface with source region in all direction.

Referring again to FIG. 2, the method 200 then proceeds from 224 to 228, where at least a part of the liner layer 170 is removed, as illustrated in FIG. 3H1, 3H2. For example, an isotropic etch process may be employed that is selective to the material of the source regions 106*a*, 106*b*, 106*c* (e.g., does not substantially etch, or etch at a much slower rate, the source regions). Removal of the liner layer 170 results in eventual formation of the structure 100 of FIGS. 1A-1D. In contrast, not removing such sections of the liner layer 170 results in eventual formation of the structure 100*g* of FIGS. 1G1-1G2. Thus, some examples may have some portion or all of liner layer 170 removed and other examples may not have any portion of liner layer 170 removed. Note the space or void 348*a*, 348*b* in FIG. 3H2 (e.g., formed by removal of the liner layer 170), which would later be filed with conductive material, to respectively form portions 148*a*, 148*b* of the upper portion 145 of the source contact 107*a* of FIG. 1E.

Referring again to FIG. 2, the method 200 then proceeds from 228 to 232, where the source contacts 107*a*, 107*b*, 107*c* are formed within the openings 306*a*, 306*b*, 306*c*, respectively, as illustrated in FIGS. 311 and 312. In some embodiments, the source contacts can be formed using any suitable techniques, such as depositing conductive material (e.g., metal, metal alloy, or other suitable electrically conductive material) within the openings 306. In some embodiments, forming the source/drain contacts may include silicidation, germanidation, III-V-idation, and/or annealing processes, for example. In some embodiments, the source and drain contacts may include aluminum or tungsten, although any suitable conductive metal or alloy can be used, such as silver, nickel, platinum, molybdenum, niobium, cobalt, tungsten, rhenium, rhodium, iridium, titanium, aluminum, gadolinium, erbium, scandium, nickel-platinum, or nickel-aluminum, for example. In some embodiments, one or more of the source contacts may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the source and drain contact regions, such as adhesion layers (e.g., titanium nitride) and/or liner or barrier layers (e.g., tantalum nitride), if so desired. In some embodiments, a contact resistance reducing layer may be present between a given source or drain region and its corresponding source or drain contact, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding source or drain region, for example. In an example, top portion of the deposited conductive materials of the source contacts may be planarized using an appropriate planarization technique, such as mechanical polishing or chemical-mechanical polishing (CMP). This completes formation of the source contacts 107*a*, 107*b*, 107*c*.

Note that the source contacts 107*a*, 107*b*, 107*c* are self-aligned to be formed above the respective source regions 106*a*, 106*b*, 106*c*. For example, as each source contact is to be formed within a corresponding bounded region (e.g., bounded by gate spacers 134*a*, 134*b* and ILD 115), the source contact automatically aligns or self-aligns to the corresponding source region.

As previously discussed herein, processes 216-232 are for forming the source contacts 107*a*, 107*b*, 107*c*. Similar processes may be performed (e.g., in parallel to the processes 212-232) for forming the drain contacts 109*a*, 109*b*, 109*c*.

Referring again to FIG. 2, the method 200 then proceeds from 232 to 236. At 236, a general integrated circuit (IC) is completed, as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure.

Note that the processes in method 200 are shown in a particular order for ease of description. However, one or more of the processes may be performed in a different order or may not be performed at all (and thus be optional), in accordance with some embodiments. Numerous variations on method 200 and the techniques described herein will be apparent in light of this disclosure.

Example System

Figure 4:
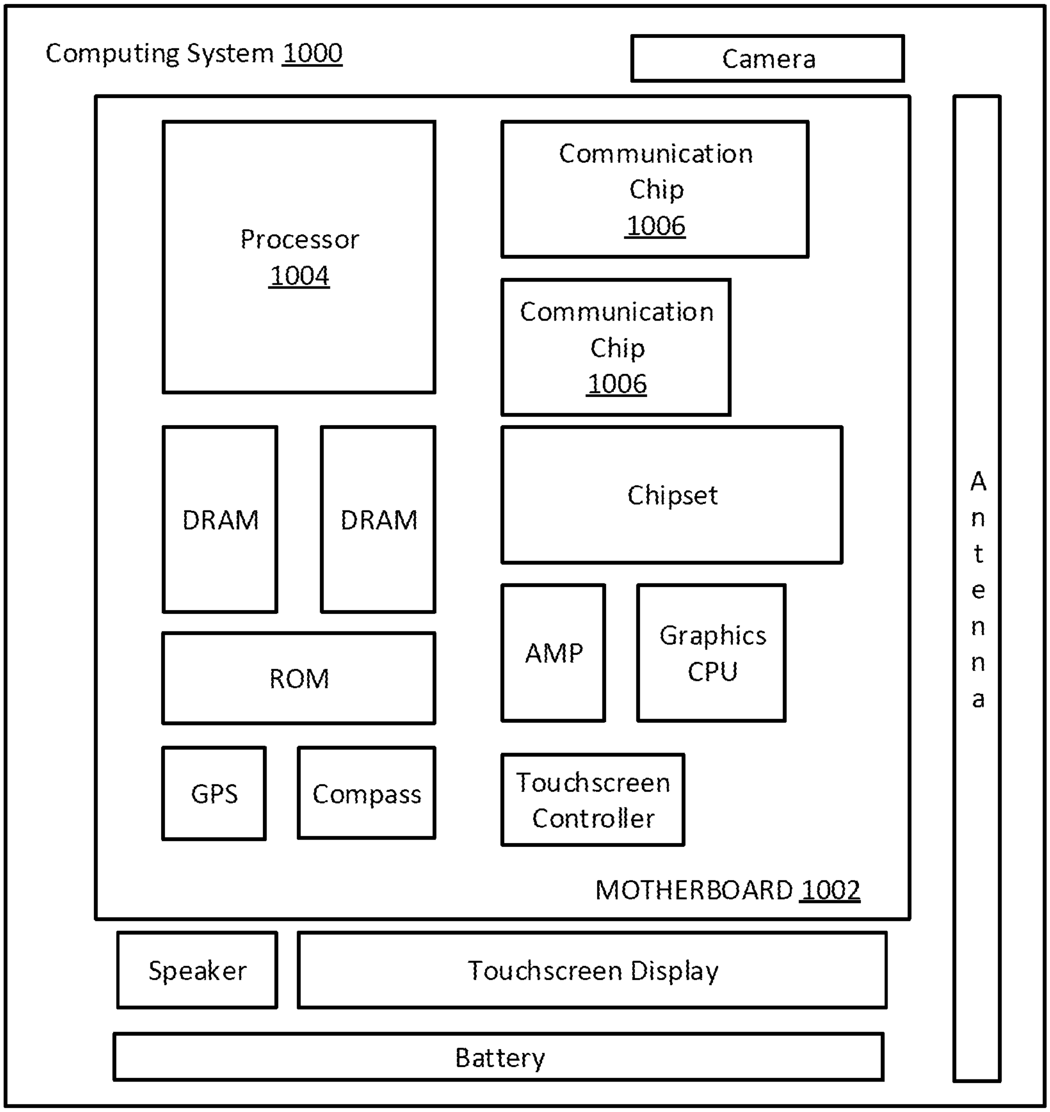
FIG. 4 illustrates a computing system implemented with integrated circuit structures formed using the techniques disclosed herein, in accordance with some embodiments of the present disclosure.

FIG. 4 illustrates a computing system 1000 implemented with integrated circuit structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1. An integrated circuit structure, comprising: a source or drain region; and a contact having (i) an upper portion outside the source or drain region and (ii) a lower portion extending within the source or drain region, wherein the source or drain region wraps around the lower portion of the contact, such that an entire perimeter of the lower portion of the contact is adjacent to the source or drain region.

Example 2. The integrated circuit structure of example 1, further comprising: a first body of dielectric material on a first side of the source or drain region, and a second body of dielectric material on a second side of the source or drain region, such that the source or drain region is laterally between the first and second bodies of dielectric material, wherein at least a corresponding section of the source or drain region is in contact with each of the first and second bodies of dielectric material, wherein a first section of the upper portion of the contact is laterally between the source or drain region and the first body of dielectric material, and a second section of the upper portion of the contact is laterally between the source or drain region and the second body of dielectric material.

Example 3. The integrated circuit structure of example 2, wherein an imaginary horizontal line passes through the first body of dielectric material, the first section of the upper portion of the contact, and the source or drain region.

Example 4. The integrated circuit structure of example 3, wherein the imaginary horizontal line further passes through the lower portion of the contact.

Example 5. The integrated circuit structure of any of examples 3-4, wherein the imaginary horizontal line further passes through the second section of the upper portion of the contact, and the second body of dielectric material.

Example 6. The integrated circuit structure of any of examples 3-5, wherein the first section of the upper portion of the contact has a bottom surface that resides in an imaginary horizontal plane which is lower than another imaginary horizontal plane in which a top surface of the source or drain region resides.

Example 7. The integrated circuit structure of any of examples 1-6, wherein the source or drain region is a first source or drain region of a first device, and wherein the integrated circuit structure further comprises: a second source or drain region of a second device, and a third source or drain region of a third device; a first body of dielectric material laterally between the first source or drain region and the second source or drain region, and a second body of dielectric material laterally between the first source or drain region and the third source or drain region; a first gate stack including a first gate spacer, and a second gate stack including a second gate spacer, wherein the first, second, and third source or drain regions are laterally between the first gate stack and the second gate stack, wherein the upper portion of the contact is in contact with the first gate spacer, the second gate spacer, the first body of dielectric material, and the second body of dielectric material.

Example 8. The integrated circuit structure of any of examples 1-7, wherein the source or drain region is a first source or drain region of a first device, and wherein the integrated circuit structure further comprises: a second source or drain region of a second device, and a third source or drain region of a third device; a first body of dielectric material laterally between the first source or drain region and the second source or drain region, and a second body of dielectric material laterally between the first source or drain region and the third source or drain region; a first gate stack including a first gate spacer, and a second gate stack including a second gate spacer, wherein the first, second, and third source or drain regions are laterally between the first gate stack and the second gate stack, wherein the upper portion of the contact is adjacent to the first gate spacer, the second gate spacer, the first body of dielectric material, and the second body of dielectric material.

Example 9. The integrated circuit structure of example 8, further comprising: a third body of dielectric material wrapping around the upper portion of the contact, wherein the third body of dielectric material is (i) between the upper portion and the first gate spacer, (ii) between the upper portion and the second gate spacer, (iii) between the upper portion and the first body of dielectric material, and (iv) between the upper portion and the second body of dielectric material.

Example 10. The integrated circuit structure of example 9, wherein an entire perimeter of the upper portion is adjacent to the third body of dielectric material.

Example 11. The integrated circuit structure of any of examples 8-10, wherein the contact is a first contact, the upper portion is a first upper portion, and the lower portion is a first lower portion, and wherein the integrated circuit structure further comprises: a second contact having (i) a second upper portion outside the second source or drain region and (ii) a second lower portion extending within the second source or drain region, wherein the second source or drain region wraps around the second lower portion of the second contact.

Example 12. The integrated circuit structure of any of examples 8-11, further comprising: first one or more bodies comprising semiconductor material extending from the first source or drain region towards the first gate stack, wherein the first gate stack wraps around the first one or more bodies; and second one or more bodies comprising semiconductor material extending from the first source or drain region towards the second gate stack, wherein the second gate stack wraps around the second one or more bodies.

Example 13. The integrated circuit structure of example 12, further comprising: third one or more bodies comprising semiconductor material extending from the second source or drain region towards the first gate stack, the first gate stack wrapping around the third one or more bodies; fourth one or more bodies comprising semiconductor material extending from the second source or drain region towards the second gate stack, the second gate stack wrapping around the fourth one or more bodies; fifth one or more bodies comprising semiconductor material extending from the third source or drain region towards the first gate stack, the first gate stack wrapping around the fifth one or more bodies; and sixth one or more bodies comprising semiconductor material extending from the third source or drain region towards the second gate stack, the second gate stack wrapping around the sixth one or more bodies.

Example 14. The integrated circuit structure of any of examples 12-13, wherein each of the first one or more bodies and the second one or more bodies comprises a vertical stack of nanoribbons, nanowires, or nanosheets.

Example 15. The integrated circuit structure of any of examples 12-13, wherein each of the first one or more bodies and the second one or more bodies comprises a fin.

Example 16. An integrated circuit structure, comprising: a first source or drain region of a first device, a second source or drain region of a second device, and a third source or drain region of a third device; a first body of dielectric material laterally between the first source or drain region and the second source or drain region, and a second body of dielectric material laterally between the first source or drain region and the third source or drain region; a first gate stack and a second gate stack, wherein the first, second, and third source or drain regions are laterally between the first gate stack and the second gate stack; and a contact having (i) a first portion outside the first source or drain region and (ii) a second portion extending within the first source or drain region, wherein the first portion of the contact is adjacent to the first gate stack, the second gate stack, the first body of dielectric material, and the second body of dielectric material.

Example 17. The integrated circuit structure of example 16, wherein the first source or drain region is adjacent to a first side surface, a second side surface, a third side surface, and a fourth side surface of the second portion of the contact.

Example 18. The integrated circuit structure of example 17, wherein the second portion of the contact comprises a plurality of side surfaces that includes the first, second, third, and fourth side surfaces, and wherein the first source or drain region is adjacent to each of the plurality of side surfaces.

Example 19. The integrated circuit structure of any of examples 16-18, wherein the first portion of the contact is in contact with each of the first gate stack, the second gate stack, the first body of dielectric material, and the second body of dielectric material.

Example 20. The integrated circuit structure of any of examples 16-19, wherein the first gate stack comprises a first gate spacer, the second gate stack comprises a second gate spacer, and wherein the first portion of the contact is in contact with each of the first gate spacer and the second gate spacer.

Example 21. A method of forming a contact extending through a first source or a drain region, comprising: forming the first source or drain region of a first device, a second source or drain region of a second device, and a third source or drain region of a third device, wherein a first body of dielectric material is laterally between the first source or drain region and the second source or drain region, and a second body of dielectric material is laterally between the first source or drain region and the third source or drain region; forming a first gate stack and a second gate stack, such that the first, second, and third source or drain regions are laterally between the first gate stack and the second gate stack; forming a layer of dielectric material above a peripheral section of a top surface of the first source or drain region, wherein the layer of dielectric material is adjacent to the first body of dielectric material, the second body of dielectric material, the first gate stack, and the second gate stack, wherein the layer defines an opening above a central section of the top surface of the first source or drain region; removing a portion of the first source or drain region through the opening, so as to extend the opening within the first source or drain region; and forming the contact having (i) a lower section within the opening that is within the first source or drain region, and (ii) an upper section outside the opening that is within the first source or drain region.

Example 22. The method of example 21, further comprising: subsequent to removing the portion of the first source or drain region through the opening, removing the layer of dielectric material from a section above the first source or drain region, wherein forming the contact comprises forming a portion of the upper section of the contact in the section above the first source or drain region.

Example 23. The method of any of examples 21-22, further comprising: subsequent to forming the first, second, and third source or drain regions, releasing a plurality of nanoribbons that extend from each of the first, second, and third source or drain regions.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure, comprising:

a source or drain region;

a contact having (i) an upper portion outside the source or drain region and (ii) a lower portion extending within the source or drain region, wherein the source or drain region wraps around the lower portion of the contact, such that an entire perimeter of the lower portion of the contact is adjacent to the source or drain region; and a first body of dielectric material on a first side of the source or drain region, and a second body of dielectric material on a second side of the source or drain region, such that the source or drain region is laterally between the first and second bodies of dielectric material, wherein at least a corresponding section of the source or drain region is in contact with each of the first and second bodies of dielectric material;

wherein a first section of the upper portion of the contact is laterally between the source or drain region and the first body of dielectric material and directly contacting both the source or drain region and the first body of dielectric material, and a second section of the upper portion of the contact is laterally between the source or drain region and the second body of dielectric material and directly contacting both the source or drain region and the second body of dielectric material.

2. The integrated circuit structure of claim 1, wherein an imaginary horizontal line passes through the first body of dielectric material, the first section of the upper portion of the contact, and the source or drain region.

3. The integrated circuit structure of claim 2, wherein the imaginary horizontal line further passes through the lower portion of the contact.

4. The integrated circuit structure of claim 2, wherein the imaginary horizontal line further passes through the second section of the upper portion of the contact, and the second body of dielectric material.

5. The integrated circuit structure of claim 2, wherein the first section of the upper portion of the contact has a bottom surface that resides in an imaginary horizontal plane which is lower than another imaginary horizontal plane in which a top surface of the source or drain region resides.

6. The integrated circuit structure of claim 1, wherein the source or drain region is a first source or drain region of a first device, and wherein the integrated circuit structure further comprises:

a second source or drain region of a second device, and a third source or drain region of a third device, wherein the first body of dielectric material is laterally between the first source or drain region and the second source or drain region, and the second body of dielectric material is laterally between the first source or drain region and the third source or drain region; and a first gate stack including a first gate spacer, and a second gate stack including a second gate spacer, wherein the first, second, and third source or drain regions are laterally between the first gate stack and the second gate stack;

wherein the upper portion of the contact is in contact with the first gate spacer and the second gate spacer.

7. The integrated circuit structure of claim 1, wherein the source or drain region is a first source or drain region of a first device, and wherein the integrated circuit structure further comprises:

a second source or drain region of a second device, and a third source or drain region of a third device, wherein the first body of dielectric material is laterally between the first source or drain region and the second source or drain region, and the second body of dielectric material is laterally between the first source or drain region and the third source or drain region; and a first gate stack including a first gate spacer, and a second gate stack including a second gate spacer, wherein the first, second, and third source or drain regions are laterally between the first gate stack and the second gate stack;

wherein the upper portion of the contact is adjacent to the first gate spacer and the second gate spacer.

8. The integrated circuit structure of claim 7, further comprising:

a third body of dielectric material wrapping around the upper portion of the contact, wherein the third body of dielectric material is (i) between the upper portion and the first gate spacer, (ii) between the upper portion and the second gate spacer, (iii) between the upper portion and the first body of dielectric material, and (iv) between the upper portion and the second body of dielectric material.

9. The integrated circuit structure of claim 8, wherein an entire perimeter of the upper portion is adjacent to the third body of dielectric material.

10. The integrated circuit structure of claim 7, wherein the contact is a first contact, the upper portion is a first upper portion, and the lower portion is a first lower portion, and wherein the integrated circuit structure further comprises:

a second contact having (i) a second upper portion outside the second source or drain region and (ii) a second lower portion extending within the second source or drain region, wherein the second source or drain region wraps around the second lower portion of the second contact.

11. The integrated circuit structure of claim 7, further comprising:

first one or more bodies comprising semiconductor material extending from the first source or drain region towards the first gate stack, wherein the first gate stack wraps around the first one or more bodies; and second one or more bodies comprising semiconductor material extending from the first source or drain region towards the second gate stack, wherein the second gate stack wraps around the second one or more bodies.

12. The integrated circuit structure of claim 11, further comprising:

third one or more bodies comprising semiconductor material extending from the second source or drain region towards the first gate stack, the first gate stack wrapping around the third one or more bodies;

fourth one or more bodies comprising semiconductor material extending from the second source or drain region towards the second gate stack, the second gate stack wrapping around the fourth one or more bodies;

fifth one or more bodies comprising semiconductor material extending from the third source or drain region towards the first gate stack, the first gate stack wrapping around the fifth one or more bodies; and sixth one or more bodies comprising semiconductor material extending from the third source or drain region towards the second gate stack, the second gate stack wrapping around the sixth one or more bodies.

13. The integrated circuit structure of claim 11, wherein each of the first one or more bodies and the second one or more bodies comprises a vertical stack of nanoribbons, nanowires, or nanosheets.

14. The integrated circuit structure of claim 11, wherein each of the first one or more bodies and the second one or more bodies comprises a fin.

15. An integrated circuit structure, comprising:

a first source or drain region of a first device, a second source or drain region of a second device, and a third source or drain region of a third device;

a first body of dielectric material laterally between the first source or drain region and the second source or drain region, and a second body of dielectric material laterally between the first source or drain region and the third source or drain region;

a first gate stack and a second gate stack, wherein the first, second, and third source or drain regions are laterally between the first gate stack and the second gate stack; and a contact having (i) a first portion outside the first source or drain region and (ii) a second portion extending within the first source or drain region, wherein the first portion of the contact is adjacent to the first gate stack, the second gate stack, the first body of dielectric material, and the second body of dielectric material;

wherein a first section of the first portion of the contact is laterally between the first source or drain region and the first body of dielectric material and directly contacting both the first source or drain region and the first body of dielectric material, and a second section of the first portion of the contact is laterally between the first source or drain region and the second body of dielectric material and directly contacting both the first source or drain region and the second body of dielectric material.

16. The integrated circuit structure of claim 15, wherein the first source or drain region is adjacent to a first side surface, a second side surface, a third side surface, and a fourth side surface of the second portion of the contact.

17. The integrated circuit structure of claim 16, wherein the second portion of the contact comprises a plurality of side surfaces that includes the first, second, third, and fourth side surfaces, and wherein the first source or drain region is adjacent to each of the plurality of side surfaces.

18. The integrated circuit structure of claim 15, wherein the first portion of the contact is in contact with each of the first gate stack, the second gate stack, the first body of dielectric material, and the second body of dielectric material.

19. An integrated circuit structure, comprising:

a source or drain region;

a contact having (i) an upper portion outside the source or drain region and (ii) a lower portion extending within the source or drain region; and a body of dielectric material wrapping around the upper portion of the contact, wherein an entire perimeter of the upper portion is directly adjacent to the body of dielectric material;

wherein a first section of the upper portion of the contact is laterally between the source or drain region and a first side of the body of dielectric material and directly contacting both the source or drain region and the first side of the body of dielectric material, and a second section of the upper portion of the contact is laterally between the source or drain region and a second side of the body of dielectric material and directly contacting both the source or drain region and the second side of the body of dielectric material.

20. The integrated circuit structure of claim 19, wherein the source or drain region wraps around the lower portion of the contact, such that an entire perimeter of the lower portion of the contact is adjacent to the source or drain region.

21. The integrated circuit structure of claim 19, wherein an imaginary horizontal line passes through the first side of the body of dielectric material, the first section of the upper portion of the contact, the source or drain region, the lower portion of the contact, the second section of the upper portion of the contact, and the second side of the body of dielectric material.

* * * * *